United States Patent
Sancon et al.

(10) Patent No.: US 12,300,300 B2
(45) Date of Patent: May 13, 2025

(54) BANK-LEVEL SELF-REFRESH

(71) Applicant: Micron Technology, Inc., Boise, ID (US)

(72) Inventors: John Christopher Sancon, Boise, ID (US); Yang Lu, Boise, ID (US); Kang-Yong Kim, Boise, ID (US); Mark Kalei Hadrick, Boise, ID (US); Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/660,199

(22) Filed: Apr. 21, 2022

(65) Prior Publication Data

US 2023/0343381 A1 Oct. 26, 2023

(51) Int. Cl.
*G11C 11/408* (2006.01)
*G11C 11/406* (2006.01)
*G11C 11/4076* (2006.01)

(52) U.S. Cl.
CPC .. *G11C 11/40618* (2013.01); *G11C 11/40615* (2013.01); *G11C 11/4076* (2013.01); *G11C 11/4085* (2013.01)

(58) Field of Classification Search
CPC ........ G11C 11/40618; G11C 11/40615; G11C 11/4076; G11C 11/4085
See application file for complete search history.

(56) References Cited

U.S. PATENT DOCUMENTS

| | | |
|---|---|---|
| 5,566,118 A | 10/1996 | Shimizu |
| 7,272,066 B2 | 9/2007 | Klein |
| 9,418,723 B2 | 8/2016 | Chishti et al. |
| 9,910,604 B2 | 3/2018 | Crawford et al. |
| 12,223,995 B2 | 2/2025 | Sancon et al. |
| 2002/0191467 A1 | 12/2002 | Matsumoto et al. |
| 2003/0007406 A1 | 1/2003 | Kyung |
| 2004/0156249 A1 | 8/2004 | Kim |
| 2005/0201174 A1* | 9/2005 | Klein ...................... G11C 7/00 365/222 |

(Continued)

OTHER PUBLICATIONS

"Non-Final Office Action", U.S. Appl. No. 17/823,407, Apr. 10, 2024, 5 pages.

(Continued)

*Primary Examiner* — Hien N Nguyen
(74) *Attorney, Agent, or Firm* — Colby Nipper PLLC

(57) ABSTRACT

Described apparatuses and methods relate to a bank-level self-refresh for a memory system. A memory device can include logic that implements self-refresh operations in the memory device. The logic may perform self-refresh operations on a set of banks of the memory device that is less than all banks within the memory device. The set of banks of the memory device may be determined such that the peak current in a power distribution network of the memory device is bounded when the self-refresh operation is performed. Accordingly, bank-level self-refresh can reduce a cost of the memory device of a memory system by enabling use of a less complicated power distribution network. The bank-level self-refresh may also be implemented with different types of refresh operations. Amongst other scenarios, bank-level self-refresh can be deployed in memory-expansion environments.

20 Claims, 12 Drawing Sheets

(56) References Cited

U.S. PATENT DOCUMENTS

| | | |
|---|---|---|
| 2011/0043888 A1* | 2/2011 | Lee ................. G02F 1/0121 |
| | | 359/279 |
| 2012/0030420 A1 | 2/2012 | Ware et al. |
| 2015/0235694 A1* | 8/2015 | Kim ............... G11C 11/40626 |
| | | 365/222 |
| 2017/0062038 A1* | 3/2017 | Doo ............... G11C 11/40603 |
| 2017/0069371 A1* | 3/2017 | Shin ............... G11C 11/40615 |
| 2017/0140810 A1* | 5/2017 | Choi .............. G11C 11/40618 |
| 2021/0318929 A1 | 10/2021 | Guim Bernat et al. |
| 2022/0066655 A1* | 3/2022 | Lee .................. G06F 11/1048 |
| 2022/0066700 A1* | 3/2022 | Kim ............... G11C 11/40615 |
| 2022/0229795 A1 | 7/2022 | Cline et al. |
| 2022/0230677 A1 | 7/2022 | Yang et al. |
| 2023/0342047 A1* | 10/2023 | Hadrick .......... G11C 11/40615 |
| 2023/0343380 A1 | 10/2023 | Sancon et al. |
| 2024/0071461 A1 | 2/2024 | Sancon et al. |

OTHER PUBLICATIONS

"Pursuant to MPEP § 2001.6(b) the applicant brings the following co-pending application to the Examiner's attention: U.S. Appl. No. 17/660,201".

"Restriction Requirement", U.S. Appl. No. 17/660,201, Jun. 12, 2024, 6 pages.

"Non-Final Office Action", U.S. Appl. No. 17/660,201, Oct. 9, 2024, 14 pages.

"Notice of Allowance", U.S. Appl. No. 17/823,407, Sep. 24, 2024, 8 pages.

"Notice of Allowance", U.S. Appl. No. 17/660,201, Mar. 13, 2025, 9 pages.

* cited by examiner

BANK-LEVEL SELF-REFRESH

BACKGROUND

Computers, smartphones, and other electronic devices rely on memory devices to maintain data to be accessed by a processor. A processor executes code based on data to run applications and provide features to a user. The processor obtains the code and the data from a memory. Volatile memory devices often include multiple banks that implement refresh operations to maintain data stored within the memory. Power is provided to these banks from a power source through a power distribution network. Memory demands in electronic devices continue to evolve and grow. For example, as application on electronic devices become increasingly complex, ever-larger data sets are needed that require ever-larger memories.

BRIEF DESCRIPTION OF THE DRAWINGS

This document describes apparatuses and techniques for bank-level self-refresh with reference to the following drawings. The same numbers are used throughout the drawings to reference like features and components:

FIG. 6-1 illustrates an example bank configuration of a memory device including at least global and local power distribution networks;

FIG. 6-2 illustrates an example timing diagram of a memory device implementing one or more aspects of bank-level self-refresh;

DETAILED DESCRIPTION

Overview

Figure 1:
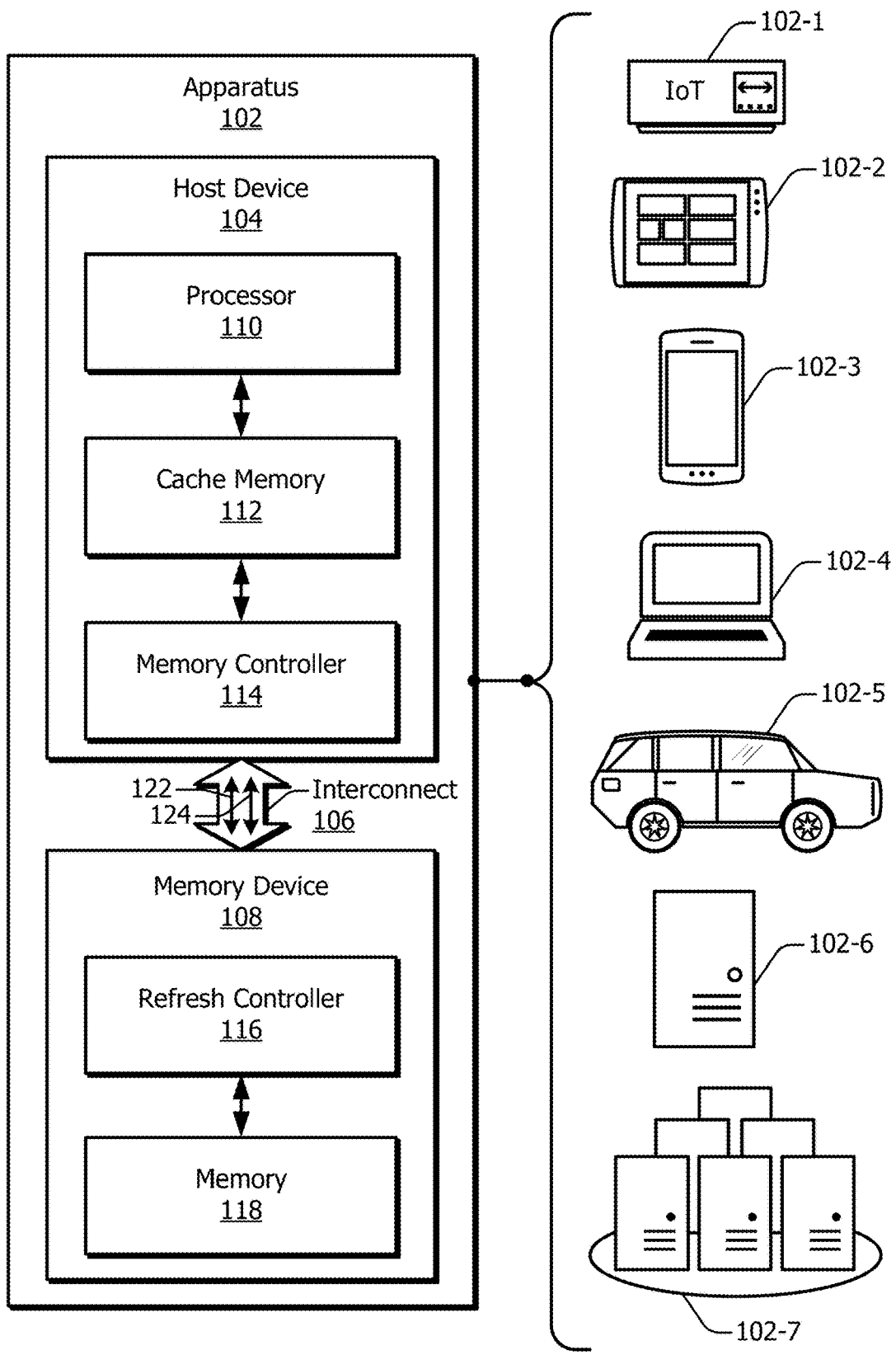
FIG. 1 illustrates an example operating environment including apparatuses that can implement bank-level self-refresh.

The increasing capabilities of electronic devices continue to require larger, higher-density memory to maintain large sets of data used in complex operations. As the storage capability of memory devices increases, electronic devices can provide enhanced features, such as high-resolution graphics and artificial intelligence. Increases in memory density and size, however, may require high metal density to provide power to the memory device through a power distribution network (PDN). Some implementations described in this document can lower PDN requirements for memory devices, including low-power memory types and high-density memory.

Double data rate synchronous dynamic random-access memory (DDR SDRAM), including low-power DDR (LPDDR) SDRAM, is a volatile memory, which means that the stored information is lost if power is not maintained. Because the memory cells of volatile DRAM are made in part from capacitors, the charge slowly drains from the memory cells and the data can be lost if the capacitor is not recharged. Therefore, to maintain an appropriate charge to represent a binary "0" or "1," the memory cells may be periodically refreshed. To perform a refresh operation, the memory reads data from a memory cell corresponding to a refresh address into a temporary storage (e.g., a sense amp) and writes the data back to the memory cell with the proper charge. A refresh address can include memory cell addresses, row addresses, bank addresses, and the like. Refresh operations may be initiated and controlled by a memory controller located outside of the memory (e.g., using an auto-refresh command) or by a controller or timer located internal to the memory (e.g., using a self-refresh operation).

Memory devices may also undergo different types of refresh operations, for example, a row-hammer-refresh (RHR) operation controlled by the external memory controller. REM operations are used to ensure that word lines within a bank are not flipped as a result of adjacent lines being read repeatedly. Memory controllers can determine target word lines that may be susceptible to flipping due to adjacent row hammering and send an RHR operation command to the memory device. In some memory devices, the RHR operation command may be included as part of an auto-refresh command.

In general, all banks of multiple DRAM banks within a memory device may be required to perform a refresh operation at least once every refresh period to accurately maintain data stored in the multiple banks of the memory device. To eliminate the need for a memory controller to issue an auto-refresh command every refresh period, a memory device may perform a self-refresh operation on all banks of the multiple banks within the memory device (e.g., an all-bank refresh). By simultaneously initiating a self-refresh operation in each bank of the multiple banks of the memory device, a PDN of the memory device may be provisioned to support the high current draw caused by an all-bank refresh across all the banks of the multiple banks. Given the relationship between minimum PDN provisioning and potential peak current, increases in memory density may proportionally increase the requirements of the PDN. These PDN requirement increases, for a given die size, can translate to an increase in the number of physical metal layers and, thus, to an increase in fabrication cost.

Generally, memory devices may be implemented in different forms and deployed in various environments. For example, memory devices can be secured to a printed circuit board (PCB), such as a motherboard. The PCB can include sockets for accepting at least one processor and one or more memories and various wiring infrastructure that enables communication between two or more components. The PCB, however, offers a finite area for the sockets and the wiring infrastructure. Some PCBs include sockets that are shaped into linear slots and are designed to accept multiple double-inline memory modules (DEVIMs). These sockets can be fully occupied by DIMMs while a processor is still able to utilize more memory. In such situations, the system can have improved performance if more memory were available.

The density of memory devices continues to increase to maximize available memory and circuit area because improved communication protocols allow for higher rates of data transfer between processors and memory devices. An example of such an improved protocol is the Compute Express Link™ (CXL™) protocol or standard (referred to hereinafter as "the CXL protocol" or "the CXL standard"). The CXL protocol can be implemented over a physical layer that is governed by, for instance, the PCIe® (Peripheral Component Interconnect Express) protocol. The CXL protocol targets intensive workloads for processors and memory devices (e.g., accelerators, memory expanders), where efficient, coherent memory access or interactions between processors and memory is advantageous.

The CXL protocol addresses some of the limitations of PCIe links by providing an interface that leverages, for example, the PCIe 5.0 physical layer and electricals, while providing lower-latency paths for memory access and coherent caching between processors and memory devices. It offers high-bandwidth, low-latency connectivity between host devices (e.g., processors, CPUs, SoCs) and memory devices (e.g., accelerators, memory expanders, memory buffers, smart input/output (I/O) devices). The CXL protocol also addresses growing high-performance computational workloads by supporting heterogeneous processing and memory systems with potential applications in artificial intelligence, machine learning, communication systems, and other high-performance computing. With the increase in memory density to utilize improved communication protocols, such as CXL, all-bank refresh operations may create large peak currents that would be supported by expensive PDNs.

In contrast to all-bank self-refresh operations, bank-level self-refresh techniques may reduce peak current and corresponding PDN requirements by reducing the quantity of banks that perform, or at least start, a self-refresh operation at a single time. In the described techniques, the memory device can perform self-refresh operations on a set (or portion) of banks of the multiple banks of the memory device. The refresh control circuitry of the memory device can be operated in an iterative fashion to allow different sets of banks of the memory device to undergo self-refresh operations at different times within a refresh period. By iteratively performing self-refresh operations on sets of banks, the quantity of banks that simultaneously initiate a self-refresh operation may be reduced from a total quantity of the multiple banks of the memory device to the quantity of banks within a set of banks, thereby reducing the peak current and the corresponding PDN requirements.

The described techniques can also employ logic to track the bank-level self-refresh operations. For example, the logic of the memory device may store in a register an indication of which banks or sets of banks have been refreshed (e.g., for a given refresh counter) while the memory device is in a self-refresh mode. Signaling indicative of a command to exit the self-refresh mode may be asserted before at least one current word line is refreshed in each bank of the multiple banks of the memory device. The register enables the memory device to track the self-refresh operations. Accordingly, in response to signaling indicative of an all-bank auto-refresh command, the memory device may "disregard" this command for those banks that have already been refreshed for the current word line. Instead, the logic of the memory device can target the remaining banks of the multiple banks that have yet to undergo a self-refresh operation on the current word line. In this way, the time that the memory device is unavailable due to refresh operations may be reduced and the latency of data transfer may be improved.

Consider an example implementation including a host device coupled to a memory device that includes control circuitry that can perform bank-level self-refresh operations. A memory controller (e.g., that is separate from or part of the host device) may command the memory device to enter a self-refresh mode where self-refresh operations are enabled. In the self-refresh mode, a refresh controller of the memory device can perform self-refresh operations on different sets of banks of the multiple banks of the memory device. For example, the refresh controller may initiate a self-refresh operation in a first set of banks of the multiple banks of the memory device. The refresh controller can maintain one or more timers that enable the memory device to implement a delay before initiating self-refresh operations in a second set of the multiple banks.

As such, the memory device may only initiate self-refresh operations in a proper subset of the multiple banks (i.e., where a proper subset of banks is fewer than all banks of the multiple banks) of the memory device. Thus, the peak current may be reduced, and the requirements for the PDN may be lowered. The refresh controller may iteratively perform self-refresh operations on memory banks within the memory device until the refresh controller receives signaling indicative of a command to exit the self-refresh mode. Additional delays may be implemented by the refresh controller to further stagger the execution of self-refresh operations within a particular set of banks of the multiple banks of the memory device. In this way, additional time delays may be applied or the number of banks engaged with each self-refresh operation may be controlled for each implementation to reduce peak current. This may extend a total time that elapses while performing the self-refresh operations on all of the multiple banks, but the PDN requirements may be further relaxed.

The bank-level self-refresh operations may be tracked using registers. For example, responsive to a self-refresh operation being performed on a set of banks, a value may be set within an associated register to indicate that the refresh operation has been performed on that set of banks. When the memory device exits the self-refresh mode, the memory controller issues at least one auto-refresh operation. In response to receiving an auto-refresh command from the memory controller, the memory device may continue a first type of refresh operation, which was also used in the self-refresh mode, from the last set of banks that completed a self-refresh operation. In some implementations, a different or second type of refresh operation (e.g., technique or algorithm) is also performed in addition to the first or "regular" type. In response to the memory controller issuing a command to perform this second type of refresh operation after the memory device exits the self-refresh mode, the memory device may perform the second type of refresh operation on each of the banks of the multiple memory banks, including those that already experienced the first type of refresh operation. Thus, with respect to each set of banks that have not undergone a self-refresh operation at the current refresh counter or word line, the memory device may perform the first type and the second type of refresh operations responsive to one or more corresponding commands received from the memory controller. As a result, each bank of the multiple banks of the memory device may be ensured to perform a refresh operation each refresh cycle without executing redundant refresh operations that increase the time in which the memory is unavailable and consume power inefficiently.

The disclosed techniques provide a bank-level self-refresh that can enable a reduction in peak current and thereby relax PDN requirements. Some implementations of bank-level self-refresh may enable self-refresh operations to be tracked and thus ensure that the unavailability of memory is reduced. In aspects, bank-level self-refresh may be particularly beneficial in situations where high-density memory is used, for example in CXL implementations, due to the greater PDN constraints of such memory devices. However, bank-level self-refresh may be implemented in various other types of memory devices to reduce peak current values and lower fabrication costs by decreasing the number of metal layers used to produce the memory chips.

Example Operating Environments

FIG. 1 illustrates an example operating environment including an apparatus 102 that can implement bank-level self-refresh. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a PCB). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit (CPU), graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a DDR memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus, switching fabric, or one or more wires that carry voltage or current signals.

In some implementations, the interconnect 106 can include at least one command and address bus 122 (CA bus 122) and at least one data bus 124 (DQ bus 124). Each bus may be a unidirectional or a bidirectional bus. The CA bus 122 and the DQ bus 124 may couple to CA and DQ pins, respectively, of the memory device 108. The interconnect 106 may also include a chip-select (CS) I/O or line (not illustrated in FIG. 1) that can, for example, couple to one or more CS pins of the memory device 108. The interconnect 106 may further include a clock bus (CK bus—not illustrated in FIG. 1) that is part of or separate from the CA bus 122.

In other implementations, the interconnect 106 can be realized as a CXL link. In other words, the interconnect 106 can comport with at least one CXL standard or protocol. The CXL link can provide an interface on top of the physical layer and electricals of a PCIe 5.0 physical layer. The CXL link can cause requests to and responses from the memory device 108 to be packaged as flits. An example implementation of the apparatus 102 with a CXL link is discussed in greater detail with respect to FIG. 4. In still other implementations, the interconnect 106 can be another type of link, including a PCIe 5.0 link. In this document, some terminology may draw from one or more of these standards or versions thereof, like the CXL standard, for clarity. The described principles, however, are also applicable to memories and systems that comport with other standards and types of interconnects.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a PCB (e.g., a rigid or flexible motherboard). The host device 104 and the memory device 108 may additionally be integrated together on an IC or fabricated on separate ICs and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 2 an example computing system architecture having at least one host device 104 coupled to a memory device 108.

Two or more memory components (e.g., modules, dies, banks, or bank groups) can share the electrical paths or couplings of the interconnect 106. In some implementations, the CA bus 122 transmits addresses and commands from the memory controller 114 of the host device 104 to the memory device 108, which may exclude propagation of data. The DQ bus 124 can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or an SoC of the apparatus 102. In some implementations, and as discussed in greater detail with respect to FIG. 2, a refresh controller 116 can also be incorporated into the memory device 108 at any functional position between the interconnect 106 and the memory 118.

As illustrated in FIG. 1, the memory device 108 can include the refresh controller 116. The refresh controller 116 may include logic to internally control refresh operations on the memory 118. For example, the refresh controller 116 may include control logic that can distribute power and command signals to portions of the memory 118 based on one or more timers. The refresh controller 116 may be configured to perform self-refresh operations (e.g., bank-level self-refresh) internal to the memory device 108. Self-refresh operations may be performed on a particular word line or set of word lines within one or more banks of the memory 118. The refresh controller 116 or another part of the memory device 108 may maintain one or more registers to track the self-refresh operations performed on the memory 118.

The memory controller 114 can transmit commands to the memory device 108 (e.g., through the refresh controller 116), including a command that causes the memory device 108 to enter or exit a self-refresh mode. When the command to enter a self-refresh mode is transmitted, the memory controller 114 or the host device 104 may cease normal operations with the memory device 108 (e.g., stop transmitting data read/write requests or other memory requests). The memory controller 114 can also receive or access a signal (e.g., from the refresh controller 116 or otherwise from the memory device 108) that indicates an operational status of the memory device 108. The signal may be based on a determination of the operational status that is made by the memory device 108 or another entity that is associated with the memory device 108 (e.g., the refresh controller 116). The operational status can include various information, including an indication of whether the memory device 108 is currently performing or undergoing a self-refresh operation (e.g., a self-refresh operational status). For example, the refresh controller 116 can determine that a self-refresh operation (e.g., a bank-level self-refresh operation) is being performed. The refresh controller 116 may make the determination of whether the self-refresh operation is currently being performed in response to receiving the command to exit the self-refresh mode.

The memory controller 114 may also transmit commands to the memory device 108 or the refresh controller 116 to perform refresh operations controlled by the memory controller 114 (e.g., an auto-refresh operation or RHR operation). The memory controller 114 may access the registers maintained by the memory device 108 or the refresh controller 116 to track the self-refresh operations of the memory device 108. Refresh operations controlled by the memory controller 114 may be performed on a particular word line or set of word lines within a set of banks of the memory 118 of the memory device 108.

Figure 2:
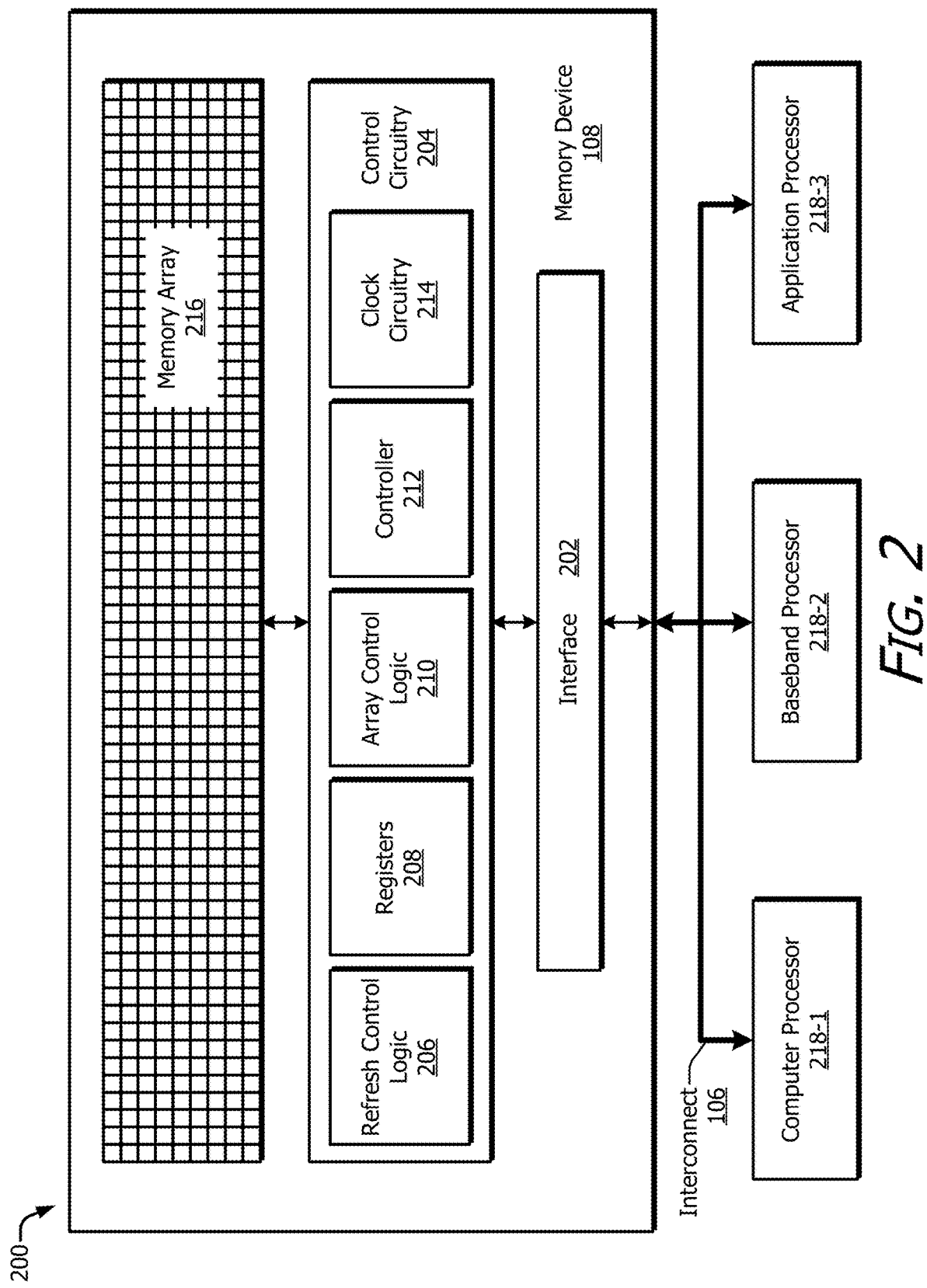
FIG. 2 illustrates an example computing system that can implement one or more aspects of bank-level self-refresh.

FIG. 2 illustrates an example computing system 200 that can implement aspects of bank-level self-refresh in a memory device. In some implementations, the computing system 200 includes at least one memory device 108, at least one interconnect 106, and at least one processor 218. In this implementation, the refresh control logic 206 (e.g., which can include the refresh controller 116 of FIG. 1) is included in the memory device 108.

The memory device 108 can include, or be associated with, at least one memory array 216, at least one interface 202, and control circuitry 204 operatively coupled to the memory array 216. The memory device 108 can correspond to one or more of the cache memory, the main memory, or a storage memory of the apparatus 102 of FIG. 1. Thus, the memory array 216 can include an array of memory cells, including but not limited to memory cells of DRAM, SDRAM, 3D-stacked DRAM, DDR memory, low-power DRAM, or LPDDR SDRAM. For example, the memory array 216 can include memory cells of SDRAM configured as a memory module with one channel containing either 16 or 8 data (DQ) signals, double-data-rate input/output (I/O) signaling, and supporting a supply voltage of 0.3 to 0.5V. The density of the memory device 108 can range, for instance, from 2 Gb to 32 Gb. The memory array 216 and the control circuitry 204 may be components on a single semiconductor die or on separate semiconductor dies. The memory array 216 or the control circuitry 204 may also be distributed across multiple dies.

The control circuitry 204 can include various components that the memory device 108 can use to perform various operations. These operations can include communicating with other devices, managing memory performance, performing refresh operations (e.g., self-refresh operations or auto-refresh operations), and performing memory read or write operations. For example, the control circuitry 204 can include refresh control logic 206, one or more registers 208, at least one instance of array control logic 210, a controller 212, and clock circuitry 214. The refresh control logic 206 may be implemented as circuitry that enables the performance of self-refresh or auto-refresh operations on the memory array 216. The registers 208 may be implemented, for example, as one or more registers (e.g., a bank-level refresh-tracking register) that can store information to be used by the control circuitry 204 or another part of the memory device 108. The array control logic 210 can include circuitry that provides command decoding, address decoding, input/output functions, amplification circuitry, power supply management, power control modes, and other functions. The clock circuitry 214 can synchronize various memory components with one or more external clock signals provided over the interconnect 106, including a command/address clock or a data clock. The clock circuitry 214 can also use an internal clock signal to synchronize memory components and may provide timer functionality to the refresh control logic 206.

The refresh control logic 206 may enable internal self-refresh operations of the memory device 108. For example, the memory device 108 may implement a self-refresh mode that enables the refresh control logic 206 to control self-refresh operations on the memory array 216. The refresh control logic 206 may be implemented separately from or within any of the control circuitry 204 or any other portion of the memory device 108. For example, the refresh control logic 206 may be implemented within the controller 212 or the array control logic 210. Additionally, the refresh control logic 206 may operate in conjunction with any other of the control circuitry 204, for example, the registers 208 or the clock circuitry 214. The refresh control logic 206 may control a power mode and can transmit signaling to the memory array 216 to perform self-refresh operations on one or more respective word lines within a set of banks of the memory array 216. One or more of the registers 208 may be maintained by the refresh control logic 206 to track self-refresh operations of the memory device 108.

The interface 202 can couple the control circuitry 204 or the memory array 216 directly or indirectly to the interconnect 106. As shown in FIG. 2, the refresh control logic 206, the registers 208, the array control logic 210, the controller 212, and the clock circuitry 214 can be part of a single component (e.g., the control circuitry 204). In other implementations, one or more of the refresh control logic 206, the registers 208, the array control logic 210, the controller 212, or the clock circuitry 214 may be separate components on a single semiconductor die or distributed across multiple semiconductor dies. These components may individually or jointly couple to the interconnect 106 via the interface 202.

The interconnect 106 may use one or more of a variety of interconnects that communicatively couple together various components and enable commands, addresses, or other information and data to be transferred between two or more components (e.g., between the memory device 108 and the processor 218). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a CA bus 122 and a DQ bus 124 (as illustrated in FIG. 1). As discussed above with respect to FIG. 1, the interconnect 106 can include a CXL link or comport with at least one CXL standard. The CXL link can provide an interface or overlay on top of the physical layer and electricals of the PCIe 5.0 physical layer.

In some aspects, the memory device 108 may be a "separate" component relative to the host device 104 (of FIG. 1) or any of the processors 218. The separate components can include a PCB, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 218, by being combined on a PCB or in a single package or an SoC.

The described apparatuses and methods may be appropriate for memory designed for lower-power operations or energy-efficient applications. An example of a memory standard related to low-power applications is the LPDDR standard for SDRAM as promulgated by the Joint Electron Device Engineering Council (JEDEC) Solid State Technology Association. In this document, some terminology may draw from one or more of these standards or versions thereof, like the LPDDR5 standard, for clarity. The described principles, however, are also applicable to memories that comport with other standards, including other LPDDR standards (e.g., earlier versions or future versions like LPDDR6) and to memories that do not adhere to a standard.

As shown in FIG. 2, the processors 218 may include a computer processor 218-1, a baseband processor 218-2, and an application processor 218-3, coupled to the memory device 108 through the interconnect 106. The processors 218 may include or form a part of a CPU, GPU, SoC, ASIC, or FPGA. In some cases, a single processor can comprise multiple processing resources, each dedicated to different functions (e.g., modem management, applications, graphics, central processing). In some implementations, the baseband processor 218-2 may include or be coupled to a modem (not illustrated in FIG. 2) and referred to as a modem processor. The modem or the baseband processor 218-2 may be coupled wirelessly to a network via, for example, cellular, Wi-Fi®, Bluetooth®, near field, or another technology or protocol for wireless communication.

In some implementations, the processors 218 may be connected directly to the memory device 108 (e.g., via the interconnect 106). In other implementations, one or more of the processors 218 may be indirectly connected to the memory device 108 (e.g., over a network connection or through one or more other devices). Further, the processor 218 may be realized as one that can communicate over a CXL-compatible interconnect. Accordingly, a respective processor 218 can include or be associated with a respective link controller, like the link controller 428 illustrated in FIG. 4. Alternatively, two or more processors 218 may access the memory device 108 using a shared link controller 428. In some of such cases, the memory device 108 may be implemented as a CXL-compatible memory device (e.g., as a CXL Type 3 memory expander) or another memory device that is compatible with a CXL protocol may also or instead be coupled to the interconnect 106.

Example Techniques and Hardware

Figure 3:
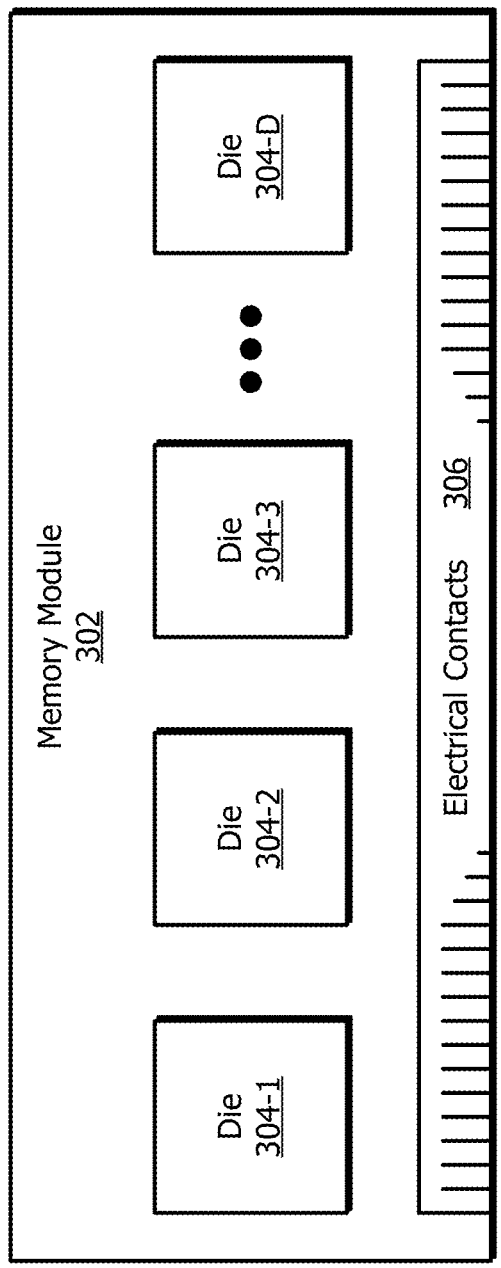
FIG. 3 illustrates an example memory device in which bank-level self-refresh may be implemented.

FIG. 3 illustrates an example memory device. An example memory module 302 includes multiple dies 304. As illustrated, the memory module 302 includes a first die 304-1, a second die 304-2, a third die 304-3, and a Dth die 304-D, with "D" representing a positive integer. As a few examples, the memory module 302 can be a SIMM or a DIMM. As another example, the memory module 302 can interface with other components via a bus interconnect (e.g., a Peripheral Component Interconnect Express (PCIe®) bus). The memory device 108 illustrated in FIGS. 1 and 2 can correspond, for example, to a single die 304, multiple dies (or dice) 304-1 through 304-D, or a memory module 302 with one or more dies 304. As shown, the memory module 302 can include one or more electrical contacts 306 (e.g., pins) to interface the memory module 302 to other components.

The memory module 302 can be implemented in various manners. For example, the memory module 302 may include a PCB, and the multiple dies 304-1 through 304-D may be mounted or otherwise attached to the PCB. The dies 304 (e.g., memory dies) may be arranged in a line or along two or more dimensions (e.g., forming a grid or array). The dies 304 may have a similar size or may have different sizes. Each die 304 may be similar to another die 304 or different in size, shape, data capacity, or control circuitries. The dies 304 may also be positioned on a single side or on multiple sides of the memory module 302. In some cases, the memory module 302 may be part of a CXL memory system or module.

Figure 4:
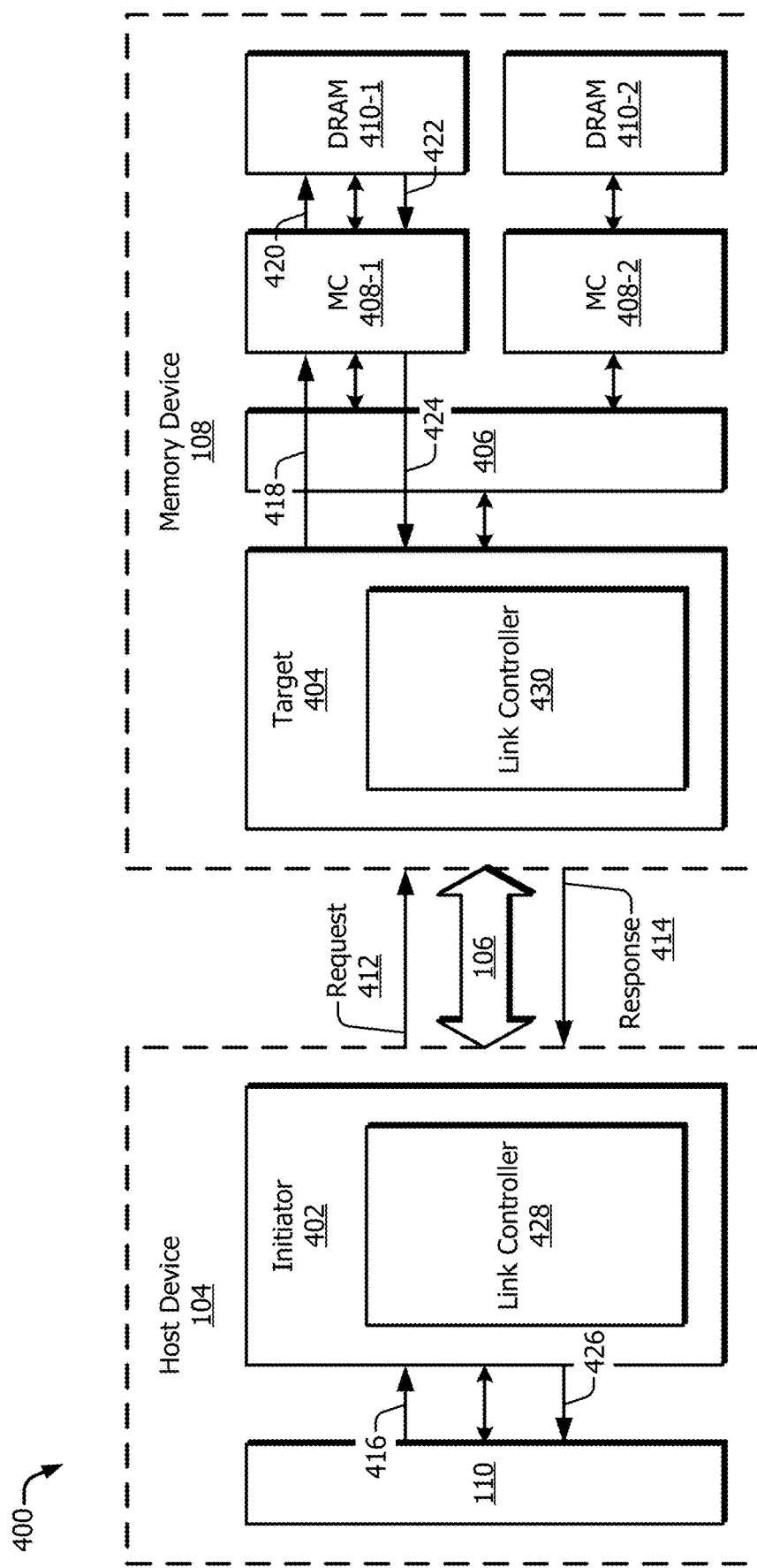
FIG. 4 illustrates an example of a system that includes a host device and a memory device coupled together via an interconnect in which bank-level self-refresh may be implemented with the memory device.

FIG. 4 illustrates an example of a system 400 that includes a host device 104 and a memory device 108 that are coupled together via an interconnect 106. The system 400 may form at least part of an apparatus 102 as shown in FIG. 1. As illustrated, the host device 104 includes a processor 110 and a link controller 428, which can be realized with at least one initiator 402. Thus, the initiator 402 can be coupled to the processor 110 or to the interconnect 106 (including to both), and the initiator 402 can be coupled between the processor 110 and the interconnect 106. Examples of initiators 402 may include a leader, a primary, a master, a main component, and so forth.

In the illustrated example system 400, the memory device 108 includes a link controller 430, which may be realized with at least one target 404. The target 404 can be coupled to the interconnect 106. Thus, the target 404 and the initiator 402 can be coupled to each other via the interconnect 106. Examples of targets 404 may include a follower, a secondary, a slave, a responding component, and so forth. The memory device 108 also includes a memory, which may be realized with at least one memory module or other component, such as a DRAM 410, as is described further below.

In example implementations, the initiator 402 includes the link controller 428, and the target 404 includes the link controller 430. The link controller 428 or the link controller 430 can instigate, coordinate, cause, or otherwise control signaling across a physical or logical link realized by the interconnect 106 in accordance with one or more protocols. The link controller 428 may be coupled to the interconnect 106. The link controller 430 may also be coupled to the interconnect 106. Thus, the link controller 428 can be coupled to the link controller 430 via the interconnect 106. Each link controller 428 or 430 may, for instance, control communications over the interconnect 106 at a link layer or at one or more other layers of a given protocol. Communication signaling may include, for example, a request 412 (e.g., a write request or a read request), a response 414 (e.g., a write response or a read response), and so forth.

The memory device 108 may further include at least one interconnect 406 and at least one memory controller 408 (e.g., MC 408-1 and MC 408-2). Within the memory device 108, and relative to the target 404, the interconnect 406, the memory controller 408, and/or the DRAM 410 (or other memory component) may be referred to as a "backend" component of the memory device 108. In some cases, the interconnect 406 is internal to the memory device 108 and may operate in a manner the same as or different from the interconnect 106.

As shown, the memory device 108 may include multiple memory controllers 408-1 and 408-2 and/or multiple DRAMs 410-1 and 410-2. Although two each are shown, the memory device 108 may include one or more memory controllers and/or one or more DRAMs. For example, a memory device 108 may include four memory controllers and 16 DRAMs, such as four DRAMs per memory controller. The memory components of the memory device 108 are depicted as DRAM only as an example, for one or more of the memory components may be implemented as another type of memory. For instance, the memory components may include nonvolatile memory like flash or PCM. Alternatively, the memory components may include other types of volatile memory like static random-access memory (SRAM). A memory device 108 may also include any combination of memory types.

In some cases, the memory device 108 may include the target 404, the interconnect 406, the at least one memory controller 408, and the at least one DRAM 410 within a single housing or other enclosure. The enclosure, however, may be omitted or may be merged with an enclosure for the host device 104, the system 400, or an apparatus 102 (of FIG. 1). The interconnect 406 can be disposed on a PCB. Each of the target 404, the memory controller 408, and the DRAM 410 may be fabricated on at least one IC and packaged together or separately. The packaged ICs may be secured to or otherwise supported by the PCB and may be directly or indirectly coupled to the interconnect 406. In other cases, the target 404, the interconnect 406, and the one or more memory controllers 408 may be integrated together into one IC. In some of such cases, this IC may be coupled to a PCB, and one or more modules for the memory components (e.g., for the DRAM 410) may also be coupled to the same PCB, which can form a CXL type of memory device 108. This memory device 108 may be enclosed within a housing or may include such a housing. The components of the memory device 108 may, however, be fabricated, packaged, combined, and/or housed in other manners.

As illustrated in FIG. 4, the target 404, including the link controller 430 thereof, can be coupled to the interconnect 406. Each memory controller 408 of the multiple memory controllers 408-1 and 408-2 can also be coupled to the interconnect 406. Accordingly, the target 404 and each memory controller 408 of the multiple memory controllers 408-1 and 408-2 can communicate with each other via the interconnect 406. Each memory controller 408 is coupled to at least one DRAM 410. As shown, each respective memory controller 408 of the multiple memory controllers 408-1 and 408-2 is coupled to at least one respective DRAM 410 of the multiple DRAMs 410-1 and 410-2. Each memory controller 408 of the multiple memory controllers 408-1 and 408-2 may, however, be coupled to a respective set of multiple DRAMs 410 (e.g., five DRAMs 410) or other memory components. As shown by way of example with respect to the DRAM 410-2, each DRAM 410 may include at least one refresh controller 116 or at least one memory 118 (e.g., also of FIG. 1), including at least one instance of both such components.

Each memory controller 408 can access at least one DRAM 410 by implementing one or more memory access protocols to facilitate reading or writing data based on at least one memory address. The memory controller 408 can increase bandwidth or reduce latency for the memory accessing based on the memory type or organization of the memory components, like the DRAMs 410. The multiple memory controllers 408-1 and 408-2 and the multiple DRAMs 410-1 and 410-2 can be organized in many different manners. For example, each memory controller 408 can realize one or more memory channels for accessing the DRAMs 410. Further, the DRAMs 410 can be manufactured to include one or more ranks, such as a single-rank or a dual-rank memory module. Each DRAM 410 (e.g., at least one DRAM IC chip) may also include multiple banks, such as 8 or 16 banks.

This document now describes examples of the host device 104 accessing the memory device 108. The examples are described in terms of a general access which may include a memory read access (e.g., a retrieval operation) or a memory write access (e.g., a storage operation). The processor 110 can provide a memory access request 416 to the initiator 402. The memory access request 416 may be propagated over a bus or other interconnect that is internal to the host device 104. This memory access request 416 may be or may include a read request or a write request. The initiator 402, such as the link controller 428 thereof, can reformulate the memory access request into a format that is suitable for the interconnect 106. This formulation may be performed based on a physical protocol or a logical protocol (including both) applicable to the interconnect 106. Examples of such protocols are described below.

The initiator 402 can thus prepare a request 412 and transmit the request 412 over the interconnect 106 to the target 404. The target 404 receives the request 412 from the initiator 402 via the interconnect 106. The target 404, including the link controller 430 thereof, can process the request 412 to determine (e.g., extract or decode) the memory access request. Based on the determined memory access request, the target 404 can forward a memory request 418 over the interconnect 406 to a memory controller 408, which is the first memory controller 408-1 in this example. For other memory accesses, the targeted data may be accessed with the second DRAM 410-2 through the second memory controller 408-2.

The first memory controller 408-1 can prepare a memory command 420 based on the memory request 418. The first memory controller 408-1 can provide the memory command 420 to the first DRAM 410-1 over an interface or interconnect appropriate for the type of DRAM or other memory component. The first DRAM 410-1 receives the memory command 420 from the first memory controller 408-1 and can perform the corresponding memory operation. The memory command 420, and corresponding memory operation, may pertain to a read operation, a write operation, a refresh operation, and so forth. Based on the results of the memory operation, the first DRAM 410-1 can generate a memory response 422. If the memory request 412 is for a read operation, the memory response 422 can include the requested data. If the memory request 412 is for a write operation, the memory response 422 can include an acknowledgment that the write operation was performed successfully. The first DRAM 410-1 can return the memory response 422 to the first memory controller 408-1.

The first memory controller 408-1 receives the memory response 422 from the first DRAM 410-1. Based on the memory response 422, the first memory controller 408-1 can prepare a memory response 424 and transmit the memory response 424 to the target 404 via the interconnect 406. The target 404 receives the memory response 424 from the first memory controller 408-1 via the interconnect 406. Based on this memory response 424, and responsive to the corresponding request 412, the target 404 can formulate a response 414 for the requested memory operation. The response 414 can include read data or a write acknowledgment and be formulated in accordance with one or more protocols of the interconnect 106.

To respond to the memory request 412 from the host device 104, the target 404 can transmit the response 414 to the initiator 402 over the interconnect 106. Thus, the initiator 402 receives the response 414 from the target 404 via the interconnect 106. The initiator 402 can therefore respond to the "originating" memory access request 416, which is from the processor 110 in this example. To do so, the initiator 402 prepares a memory access response 426 using the information from the response 414 and provides the memory access response 426 to the processor 110. In this way, the host device 104 can obtain memory access services from the memory device 108 using the interconnect 106. Example aspects of an interconnect 106 are described next.

The interconnect 106 can be implemented in a myriad of manners to enable memory-related communications to be exchanged between the initiator 402 and the target 404. Generally, the interconnect 106 can carry memory-related information, such as data or a memory address, between the initiator 402 and the target 404. In some cases, the initiator 402 or the target 404 (including both) can prepare memory-related information for communication across the interconnect 106 by encapsulating such information. The memory-related information can be encapsulated into, for example, at least one packet (e.g., a flit). One or more packets may include headers with information indicating or describing the content of each packet.

In example implementations, the interconnect 106 can support, enforce, or enable memory coherency for a shared memory system, for a cache memory, for combinations thereof, and so forth. Additionally or alternatively, the interconnect 106 can be operated based on a credit allocation system. Possession of a credit can enable an entity, such as the initiator 402, to transmit another memory request 412 to the target 404. The target 404 may return credits to "refill" a credit balance at the initiator 402. A credit-based communication scheme across the interconnect 106 may be implemented by credit logic of the target 404 or by credit logic of the initiator 402 (including by both working together in tandem). Examples of bank-level self-refresh are described herein with reference to at least one memory controller 408 and at least one DRAM 410, including a refresh controller thereof. Example aspects of the memory controller 408, the refresh controller, and multiple banks of the DRAM 410 are described below with reference to FIGS. 5 through 10. Additionally or alternatively, the memory controller 114 (of FIG. 1) may also guide or support refresh operations of the DRAMs 410 or multiple banks of the dies 304 (of FIG. 3).

The system 400, the initiator 402 of the host device 104, or the target 404 of the memory device 108 may operate or interface with the interconnect 106 in accordance with one or more physical or logical protocols. For example, the interconnect 106 may be built in accordance with a Peripheral Component Interconnect Express (PCIe or PCI-e) standard. Applicable versions of the PCIe standard may include 1.x, 2.x, 3.x, 4.0, 5.0, 6.0, and future or alternative versions. In some cases, at least one other standard is layered over the physical-oriented PCIe standard. For example, the initiator 402 or the target 404 can communicate over the interconnect 106 in accordance with a Compute Express Link (CXL) standard. Applicable versions of the CXL standard may include 1.x, 2.0, and future or alternative versions. The CXL standard may operate based on credits, such as read credits and write credits. In such implementations, the link controller 428 and the link controller 430 can be CXL controllers.

Figure 5:
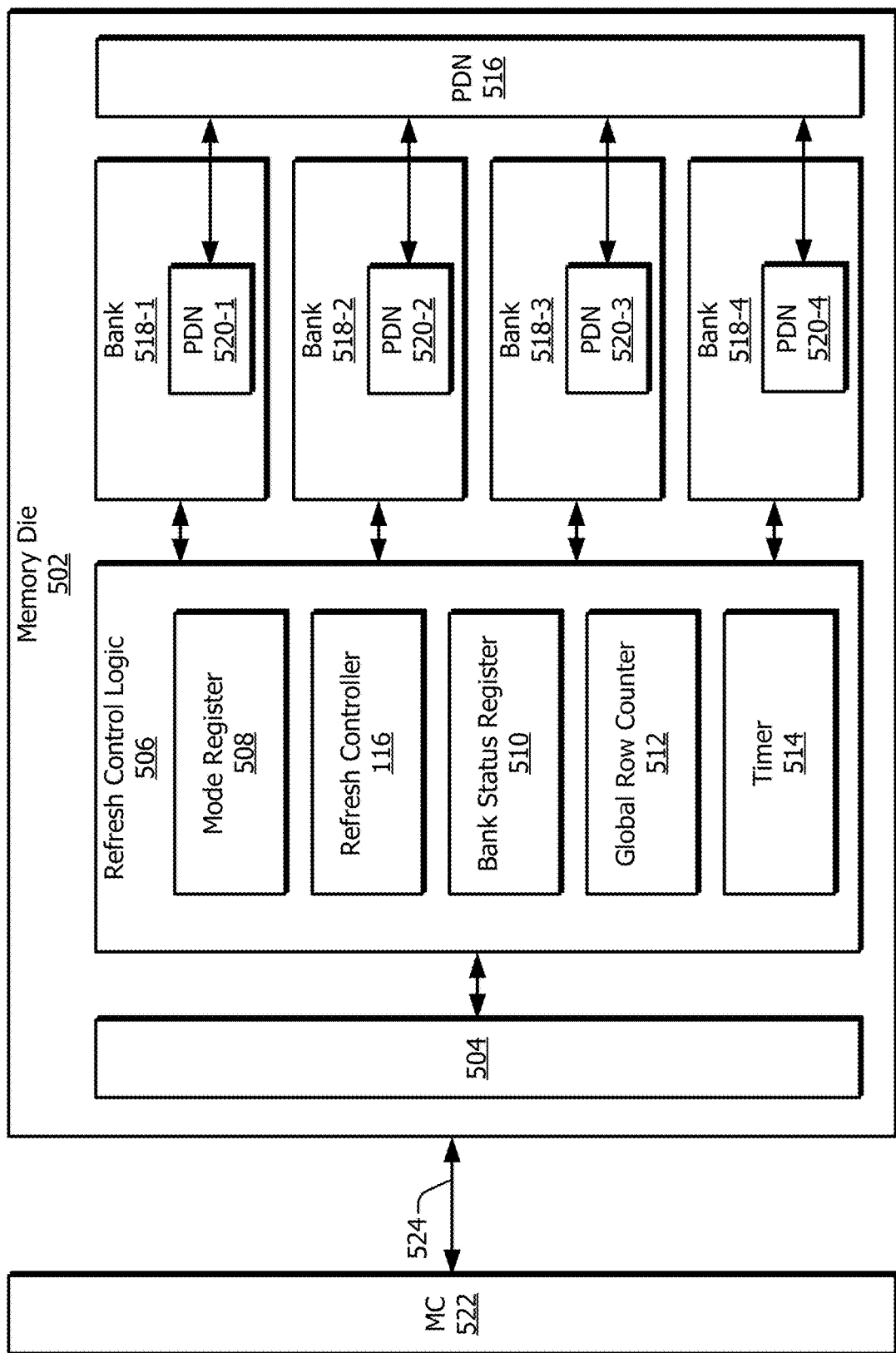
FIG. 5 illustrates an example memory die that can implement one or more aspects of bank-level self-refresh.

FIG. 5 illustrates an example memory die 502 that can implement one or more aspects of bank-level self-refresh. The memory die 502 may be implemented as part of a memory device (e.g., the memory device 108 of FIG. 1, 2, or 4 and/or including at least a portion of the memory module 302 of FIG. 3). The memory device may include any number of memory dies, as described with respect to FIG. 3. As illustrated, the memory die 502 can be coupled to a memory controller 522 via an interconnect 524 using an interface 504. The memory controller 522 can correspond to the host-side memory controller 114 (of FIG. 1) or to the memory-side memory controller 408 (of FIG. 4). The memory controller 522 may initiate or control operations of the memory die 502, such as refresh operations.

The memory die 502 includes refresh control logic 506 that can perform refresh operations, such as auto-refresh or self-refresh operations. In the depicted example, the refresh control logic 506 includes at least one mode register 508, at least one refresh controller 116, at least one bank status register 510, at least one global row counter 512, and at least one timer 514. The refresh control logic 506 may interface with a global PDN 516 that provides power to multiple banks 518 using multiple local PDNs 520. Although illustrated as including four banks (bank 518-1, bank 518-2, bank 518-3, and bank 518-4), the memory die 502 may include any number of banks. Each of the banks 518 may be coupled to a local PDN (local PDN 520-1, local PDN 520-2, local PDN 520-3, and local PDN 520-4). The local PDNs 520 may receive power from the global PDN 516. Any of the banks 518 may share a local PDN 520 with one or more other banks 518. Examples of local and global PDNs are described below with reference to FIG. 6-1. The refresh control logic 506 may include delay circuitry to implement a time delay to limit the number of the banks 518 that execute a self-refresh operation at a same time.

The refresh control logic 506 may implement or operate in multiple refresh modes, for example, an auto-refresh mode (e.g., where refresh operations are externally controlled by the memory controller 522) and a self-refresh mode (e.g., where internally controlled refresh operations of the memory device are enabled). The refresh mode may be indicated by the mode register 508. For example, the memory controller 522 may set the mode register 508 to maintain a first value (e.g., a one) when the refresh control logic 506 is to operate in accordance with the self-refresh mode. Alternatively, the mode register 508 may be set to maintain a second value (e.g., a zero) when the memory controller 522 determines that the refresh control logic 506 is to operate in accordance with an auto-refresh mode.

The refresh controller 116 may be implemented within the refresh control logic 506 to perform the refresh operations in accordance with any of the refresh modes. The refresh controller 116 may be coupled to any of the other components within the refresh control logic 506. For example, the refresh controller 116 may store a value within the bank status register 510, maintain the global row counter 512, or utilize the timer 514. The refresh controller 116 may select banks for refresh based on the distribution of power across the global PDN 516 or the local PDNs 520. Power may be distributed to respective banks 518 within the memory die 502 to enable refresh and other memory operations.

The memory controller 522 may transmit signaling indicative of a command to enter the self-refresh mode to the memory device (e.g., received at the refresh controller 116). The mode register 508 may be set to the value associated with the self-refresh mode, and the refresh control logic 506 may operate in accordance with the self-refresh mode. In the self-refresh mode, the memory device may perform bank-level self-refresh operations based on the internal timer 514 or counter (e.g., a self-refresh timer that is internal to the memory device). During a self-refresh operation, the memory device may be unable to perform some functions, such as responding to certain activation commands and data read/write requests.

When any of the banks 518 performs a self-refresh operation on a current word line (e.g., as determined based on the global row counter 512), the value stored within the bank status register 510 that corresponds to the given bank may be altered (e.g., written) to a value that indicates that a self-refresh operation has been performed on the bank. In this way, the bank status register 510 may be used to track progress on the self-refresh operations of the banks 518. Although illustrated as being within the refresh control logic 506, the bank status register 510 may be implemented in any number of ways, for example, external to the refresh control logic 506, external to memory die 502, or external to the memory device. In some implementations, the bank status register 510 may be implemented as multiple registers each associated with one or more of the banks 518. The bank status register 510 may be implemented within the banks 518 or external to the banks 518. The registers of the bank status register 510 may be co-located with each other or distributed (e.g., proximately to each respective bank 518). Once a self-refresh operation is performed on a particular set of word lines corresponding to a current row address from the global row counter 512 within all banks of multiple banks 518 (e.g., a selected quantity of banks—up to all banks on a chip), the refresh controller 116 may begin self-refresh operations on a different set of word lines. To indicate the start of self-refresh operations on the different set of word lines, the bank status register 510 may be reset to indicate that none of the banks 518 have performed self-refresh operations on the different set of word lines.

Additionally or alternatively, the value stored within the global row counter 512 may be altered (e.g., incremented) to a value indicative of the different set of word lines. The global row counter 512 may be used to indicate a current set of word lines that are to undergo self-refresh operations (e.g., a set of word lines across the multiple banks, with each word line in each bank having a same row address). Responsive to a self-refresh operation being performed on the current set of word lines within each of the multiple banks 518, the refresh controller 116 may increment the value stored in the global row counter 512 to track self-refresh operations on a new set of word lines. If the refresh controller 116 receives signaling indicative of a command to exit the self-refresh mode, the bank status register 510 and the global row counter 512 may be used to indicate where self-refresh operations terminated. In this way, the banks 518 may seamlessly continue refresh operations in the auto-refresh mode without necessarily performing redundant refresh operations that are not currently needed.

In the self-refresh mode, the timer 514 may be used to synchronize the operations of the refresh controller 116. For example, the timer 514 may be used to execute a time delay (e.g., a refresh delay) between the initiation of self-refresh operations in a first set of banks of the multiple banks 518 and the initiation of self-refresh operations in a second set of banks of the multiple banks 518. In some implementations, the timer 514 may also or instead be used to execute a time delay (e.g., a bank stagger delay) between self-refresh operations performed on different banks within a single set of banks. Examples of these types of delays are described below with reference to FIG. 6-2.

In aspects, the timer 514 may be used to determine the exit from the self-refresh mode. For example, the refresh control logic 506 may be configured to operate in accordance with the self-refresh mode for a certain period of time after receiving signaling indicative of a command to enter the self-refresh mode. In this way, the timer 514 may begin tracking the time that the refresh control logic 506 operates in the self-refresh mode, and after the timer 514 reaches a predetermined value (e.g., a prescribed amount of time elapses), the refresh control logic 506 may exit the self-refresh mode without receiving another command from the memory controller 522. Refresh operations may also be synchronized with a clock cycle maintained by the timer 514. As a result, the refresh control logic 506 may internally operate in the self-refresh mode without intervention from the host device (e.g., host device 104) or the memory controller 522.

In some implementations, the refresh control logic 506 exits the self-refresh mode in response to receiving, from the memory controller 522, signaling indicative of a command to exit the self-refresh mode. Outside of the self-refresh mode (e.g., in the auto-refresh mode), the memory controller 522 may control refresh operations on the banks 518. The memory controller 522 may control a first type of refresh operation on the banks that ensures that all of the banks 518 are refreshed every refresh cycle. The first type of refresh operation may continue from the point that the self-refresh operations terminated as is described herein. For example, the bank status register 510 or the global row counter 512 may be used to determine which banks 518 have not already performed a refresh operation while in the self-refresh mode on specific word lines within a current refresh cycle if other banks 518 have performed a refresh operation on those specific word lines.

Like in the self-refresh mode, the bank status register 510 or the global row counter 512 may be updated responsive to refresh operations being performed on the banks 518. Specifically, the bank status register 510 may be used to indicate the banks that have had a self-refresh operation or an auto-refresh operation performed on a specific set of word lines. In contrast, the global row counter 512 may be used to indicate the current set of word lines that the refresh operations of the first type are being performed on.

The memory controller 522 may also control a second type of refresh operation (e.g., a different type of algorithm or technique) on the banks 518. The second refresh type may involve identification of word lines or sets of word lines that are to perform a refresh operation. In aspects, the second refresh type may be performed on a specified and/or different set of word lines than is due or up next for the first refresh type. The memory controller 522 may command the memory device to perform the refresh operation of the first type and the refresh operation of the second type during some time interval. Similar to the self-refresh operations, the auto-refresh operation of the first type and the auto-refresh operation of the second type may be performed iteratively on sets of the banks 518 to reduce peak current. Unlike the self-refresh operations, the auto-refresh operations may be controlled external from the memory device through an external timer.

Figures 1, 6:
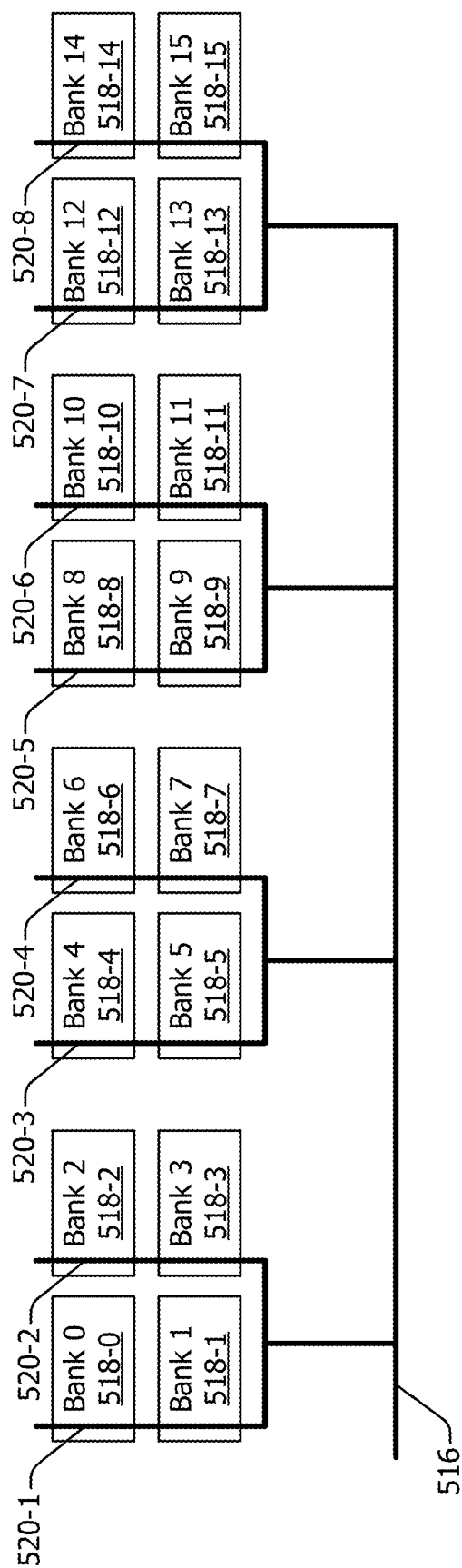
Figures 2, 6:
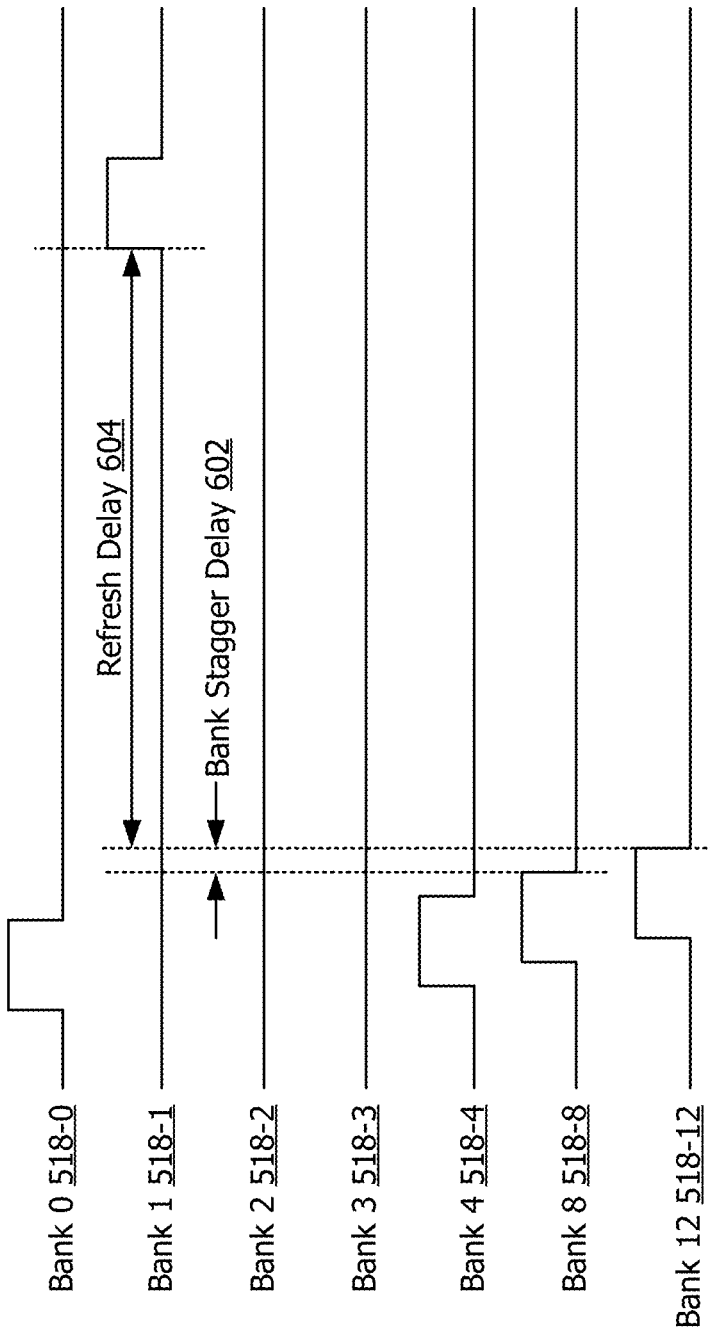

FIG. 6-1 illustrates an example bank configuration of a memory device including a global PDN 516 and local PDNs 520. In aspects, FIG. 6-1 illustrates at least part of a memory die (e.g., as depicted in FIGS. 3 and 5) of the memory device. The memory die may include any number of banks 518, for example, sixteen banks as illustrated. Further, a memory die may include two or more "super sets" of multiple banks 518, such as two super sets of sixteen banks apiece. Each of the banks 518 may be connected to a local PDN 520. The local PDNs 120 may connect to a global PDN 516 that distributes power to each of the local PDNs 520.

For a given global PDN 516, each bank 518 of the sixteen corresponding multiple banks 518-0 to 581-15 receives power via the global PDN 516. For a given local PDN 520 (e.g., a first local PDN 520-1), there is at least one bank 518 (e.g., a first bank 518-1) that obtains power from that local PDN 520, and there is at least one other local PDN 520 (e.g., a second local PDN 520-2 or a fifth local PDN 520-5) that provides power to a different bank 518 (e.g., a second bank 518-2 or a ninth bank 518-9, respectively). In some cases, a global PDN 516 may also include multiple regional PDNs in addition to multiple local PDNs 520. For example, a regional PDN can include multiple local PDNs 520 but fewer than all local PDNs 520 of the global PDN 516. Further, the multiple local PDNs 520 that are part of a common regional PDN may receive power via a common branch of the global PDN 516. For instance, the first and second local PDNs 520-1 and 520-2 may form one regional PDN, and the fifth and sixth local PDNs 520-5 and 520-6 may form a different regional PDN.

The global PDN 516 and the local PDNs 520 may be implemented using conductive circuitry to distribute power throughout the banks of the memory device. This conductive circuitry may be implemented using physical metal mask layers that connect a power source to the banks 518. The number of physical metal mask layers used to supply power to the banks 518 may be dependent on the peak current that is to be supported by the PDNs. As such, lowering peak current requirements, for example, during self-refresh operations, may reduce the number of physical metal mask layers used to implement the global PDN 516 and local PDNs 520.

In some implementations, any of the banks 518 may share a local PDN 520 with at least one other bank 518 of the multiple banks 518. For example, bank 518-0 shares local PDN 520-1 with bank 518-1, bank 518-2 shares local PDN 520-2 with bank 518-3, bank 518-4 shares local PDN 520-3 with bank 518-5, and bank 518-6 shares local PDN 520-4 with bank 518-7. Further, bank 518-8 shares local PDN 520-5 with bank 518-9, bank 518-10 shares local PDN 520-6 with bank 518-11, bank 518-12 shares local PDN 520-7 with bank 518-13, and bank 518-14 shares local PDN 520-8 with bank 518-15. In aspects, the voltage drop across the global PDN 516 or the local PDNs 520 may increase when multiple ones of the banks 518 that share a common PDN (e.g., global PDN 516 or local PDNs 520) perform refresh operations during a same time interval. To supply power in these instances, a large peak current may be drawn across the global PDN 516 or the local PDNs 520. When bank-level self-refresh is implemented, however, sets of banks may be selected to iteratively perform self-refresh operations such that the peak current is reduced across the global PDN 516 or local PDNs 520. Additionally, the quantity of banks within each set of banks that perform self-refresh operations may be adjusted in a tradeoff between decreasing peak current and increasing the time it takes to perform a refresh on all banks of the multiple banks 518.

In the illustrated example of FIG. 6-1, each set of banks may include any quantity of banks, such as two, four, or eight banks, that is less than all the banks in the sixteen multiple banks (or any other number of the multiple banks e.g., twenty-four, thirty-two, sixty-four). The multiple banks (e.g., the portion of the multiple banks and the additional portion of the multiple banks) may include any number of sets of banks. For example, if a quantity of the multiple banks is a first number and a quantity of banks within the portion of the multiple banks is a second number, then the multiple banks may be defined by a third number of sets of banks, where the third number is the first number divided by the second number. In a four-bank example, the first set of banks may be selected to include bank 518-0, bank 518-4, bank 518-8, and bank 518-12 to ensure that no two banks sharing a same local PDN 520 perform a self-refresh operation together. This selection lowers the peak current drawn from the global PDN 516 and each individual local PDN 520. A second set of banks may include bank 518-2, bank 518-6, bank 518-10, and bank 518-14 to maintain distribution of the selected banks across the PDNs. A third set of banks that may then perform self-refresh operations can include bank 518-1, bank 518-5, bank 518-9, and bank 518-13. Then the remaining banks (e.g., bank 518-3, bank 518-7, bank 518-11, and bank 518-15) may be included within a fourth set of banks to perform self-refresh operations.

Note that the quantity of banks 518 shown in FIG. 6-1 is just an example and other implementations may include more or fewer of the banks 518. Additionally, the quantity of banks per set of banks that perform self-refresh operations may be altered in different implementations. For example, each set of banks may include two banks and the sets of banks may be selected to increase (e.g., maximize) the distance—from a PDN perspective—between each bank within a given set of two banks (e.g., bank 518-0 and bank 518-8 may be selected as a set of banks in a two-bank per set self-refresh implementation). In some cases, PDN distance may be increased by selecting for a set of banks those banks that are in different regional PDNs as well as in different local PDNs 520. In other implementations, each set of banks may include three banks, six banks, eight banks, sixteen banks, thirty-two banks, or any other quantity of banks.

FIG. 6-2 illustrates an example timing diagram of a memory device implementing one or more aspects of bank-level self-refresh. As shown in FIG. 6-1, the memory device includes sixteen banks. As depicted in FIG. 6-2, bank-level self-refresh operations are performed iteratively on sets of four banks. However, it should be appreciated that in other implementations the total quantity of banks and the quantity of banks within each set of banks may be different than in this example. The example timing diagram depicts self-refresh operations that ensure that each word line of the banks is refreshed at least once per refresh period.

In this example, a first set of banks that include bank 518-0, bank 518-4, bank 518-8, and bank 518-12 may perform self-refresh operations "together" as a set. In some implementations, the memory device may delay by a bank stagger delay 602 temporally adjacent performances of the self-refresh operations for each bank of a set of banks. For example, bank 518-0 may initiate a self-refresh operation at a specific one or more word lines. The bank stagger delay 602 may then be implemented to delay execution of the self-refresh operation on the specific one or more word lines within the bank 518-4. Similarly, the bank stagger delay 602 may be observed between performance of the self-refresh operation in bank 518-4 and bank 518-8 and between bank 518-8 and bank 518-12. After each bank within the first set of banks has performed a self-refresh operation on the specific one or more word lines, a refresh delay 604 may be performed to delay execution of the self-refresh operations on the specific one or more word lines of the additional sets of banks (e.g., beginning at bank 518-1 as shown).

By delaying the performance of self-refresh operations between each set of banks, the peak current may be limited, because only a subset (e.g., a "proper" subset) of the multiple banks 518 perform a self-refresh operation during a particular time interval. Additionally, the peak current drawn to perform self-refresh operations within a single set of banks may be further reduced by imposing the bank stagger delay 602 between performances of temporally adjacent self-refresh operations in one or more of the banks within the set of banks. In some aspects, the refresh delay 604 or the bank stagger delay 602 may be controlled by a timer internal to the memory device (e.g., the timer 514 of FIG. 5).

Figure 7:
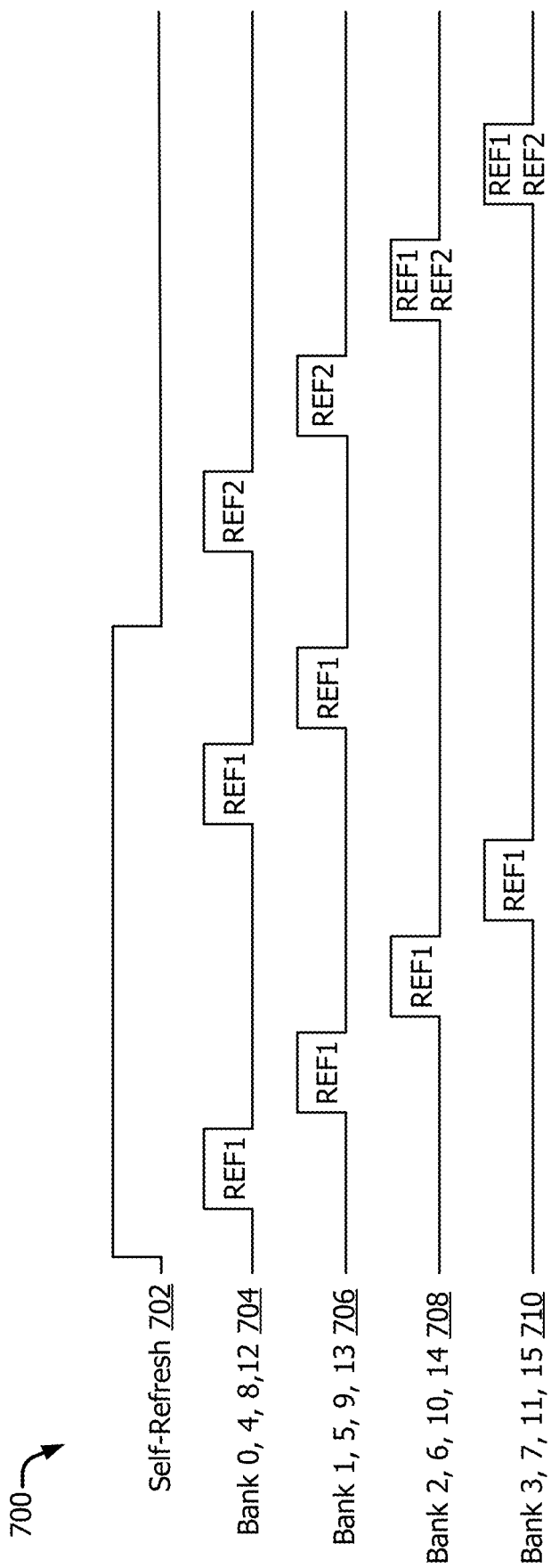
FIG. 7 illustrates an example timing diagram of a memory device implementing multiple types of refresh operations in accordance with one or more aspects of bank-level self-refresh.

FIG. 7 illustrates an example timing diagram 700 of a memory device that can implement multiple types of refresh operations in accordance with one or more aspects of bank-level self-refresh. Like in FIGS. 6-1 and 6-2, the memory device includes sixteen banks, and bank-level self-refresh operations are performed iteratively on sets of four banks; however, other implementations are possible. The memory device includes a self-refresh mode 702 that when active can enable the performance of self-refresh operations in accordance with one or more aspects of bank-level self-refresh. The self-refresh mode 702 may be entered in response to receiving, from a memory controller, signaling indicative of a command to enter the self-refresh mode. In the self-refresh mode 702, bank-level self-refresh operations may be performed as discussed with respect to FIG. 6-2.

The refresh control logic 506 (of FIG. 5) can implement different types of refresh operations on the multiple banks. For example, for a self-refresh mode 702, the refresh controller 116 can perform refresh operations of a first type ("REF1"). Thus, a first set of banks 704 performs self-refresh operations on a first set of one or more word lines. Self-refresh operations may then be performed on the first set of the one or more word lines within the second set of banks 706. Then, a third set of banks 708 may perform the self-refresh operations on the first set of the one or more word lines. After the third set of banks 708 has performed the self-refresh operations, a fourth set of banks 710 may perform the self-refresh operations on the first set of the one or more word lines. It should be noted that performance of the self-refresh operations on one or more banks within a set of banks may be staggered (e.g., by the bank stagger delay 602 of FIG. 6-2) or the performance of a self-refresh operation on any two temporally adjacent sets of banks may be delayed (e.g., by the refresh delay 604 of FIG. 6-2), as described with reference to FIG. 6-2.

After a first set of self-refresh operations have been performed on the first set of one or more word lines within each set of banks of the multiple banks, a second set of self-refresh operations may be performed on a second set of one or more word lines different from the first set of one or more word lines. With the self-refresh mode 702 still in effect, the refresh controller 116 can continue to perform refresh operations of the first type ("REF1"). In this way, the self-refresh operations may be performed iteratively until all word-lines within the banks have been refreshed or until the self-refresh mode 702 is exited. In a second iteration, the self-refresh operations may continue at the first set of banks 704 to be performed on the second set of one or more word lines. The refresh controller 116 (e.g., of FIG. 5) can write a value to at least one bit of the bank status register 510 corresponding to the first set of banks 704 to indicate that the refresh operations have been completed on the first set of banks 704.

Once performed, the self-refresh operations may be performed on the second set of banks 706. In response to this performance, the refresh controller 116 can write a value to at least one bit of the bank status register 510 corresponding to the second set of banks 706 to indicate that the refresh operations have been completed on the second set of banks 706. In the illustrated example, the self-refresh mode 702 is exited before the second set of self-refresh operations are performed on the second set of one or more word lines within the third set of banks 708. In some instances, the self-refresh mode 702 is exited in response to receipt of signaling that is transmitted from the memory controller and that indicates a command to exit the self-refresh mode 702.

Outside the self-refresh mode 702 (e.g., in an auto-refresh mode), refresh operations of the first type ("REF1") may be performed or refresh operations of a second type ("REF2") may be performed. In some implementations, these refresh operations may be controlled by a memory controller (e.g., the memory controller 522) that is external to the memory die or memory device, such as by using an auto-refresh command (e.g., an all-bank auto-refresh command). In some implementations, it may be determined that the refresh operations of the first type or the refresh operations of the second type are not needed to maintain stored data, for example, if a refresh operation of the same type has already been performed recently on the word line or set of word lines within the one or more banks. In aspects, refresh operations of the first type may not be needed if each word line within each of the banks of a set of banks has performed a refresh operation of the first type within a current refresh cycle. The refresh controller 116 can determine this based on the bank status register 510. Like the self-refresh operations, the auto-refresh operations, which are controlled by a memory controller, may be performed iteratively on different sets of banks. Moreover, the different sets of banks may iteratively perform refresh operations on different sets of word lines. In some implementations, the refresh operations of the first type and the refresh operations of the second type may be performed within a same time period. However, these refresh operations may be performed on different sets of word lines with respect to one another.

In the example implementation of FIG. 7, refresh operations may be performed after exit from the self-refresh mode 702 responsive to one or more auto-refresh commands received from the memory controller 522. For instance, refresh operations of the second type can be performed on the first set of banks 704 at a specific set of word lines. The specific set of word lines may be different from or the same as either of the first set of word lines or the second set of word lines that were refreshed in the self-refresh mode 702. The memory device or the memory controller may determine that a refresh operation of the first type is not needed within the first set of banks 704 because a self-refresh operation has already been performed on the second set of the word lines within the first set of banks 704. In some cases, the refresh controller 116 can determine this based on values written to the bank status register 510 and then omit, decline, or skip performing a refresh operation of the first type. As such, the first set of banks 704 may perform refresh operations of the second type but exclude refresh operations of the first type during a first iteration after exiting the self-refresh mode 702.

The second set of banks 706 may then perform refresh operations of the second type on a specific set of word lines, which may be indicated by the memory controller 522. This specific set of word lines may be the same as or different from the specific set of word lines that perform the refresh operations of the second type within the first set of banks 704. Like with the first set of banks 704, the refresh controller 116 may determine that the refresh operations of the first type are not needed on the second set of word lines within the second set of banks 706 because self-refresh operations have already been performed. This determination may be made with reference to the one or more bits corresponding to the second set of banks 706 that are present in the bank status register 510.

The memory controller 522 may then initiate refresh operations of the first type and refresh operations of the second type on the third set of banks 708. In this instance, the memory controller 522 or the memory device may determine that the self-refresh mode 702 was exited before self-refresh operations were performed on the second set of one or more word lines within the third set of banks 708. As such, the memory device does not decline to perform or omit performance of refresh operations of the first type on the third set of banks 708. Thus, the memory controller 522 may seamlessly continue auto-refresh operations where the self-refresh operations terminated. In addition, the refresh operations of the second type may be performed on the third set of banks 708 during a same time interval as the refresh operations of the first type and on a same or different set of word lines than the second set of word lines. In aspects, this may reduce the time during which banks are activated to perform refresh operations.

Similar to the third set of banks 708, the fourth set of banks 710 may perform the refresh operations of the first type and the refresh operations of the second type. Once the refresh operations have been performed on the fourth set of banks 710, another iteration may begin. With this other iteration, a refresh operation of at least the first type may be performed on a third set of one or more word lines within the first set of banks 704. The memory device may perform additional iterations until each word line within the banks has been refreshed within the current refresh cycle. In this way, it may be ensured that each word line of the multiple banks is refreshed at least once every refresh cycle. Although the timing diagram illustrates performing the refresh operation of the second type outside of the self-refresh mode 702, it may be determined that the refresh operation of the second type is not needed in one or more of the sets of banks. As such, it should be noted that the refresh operation of the first type may be performed without performing the refresh operation of the second type outside of the self-refresh mode 702.

Example Methods

Figure 8:
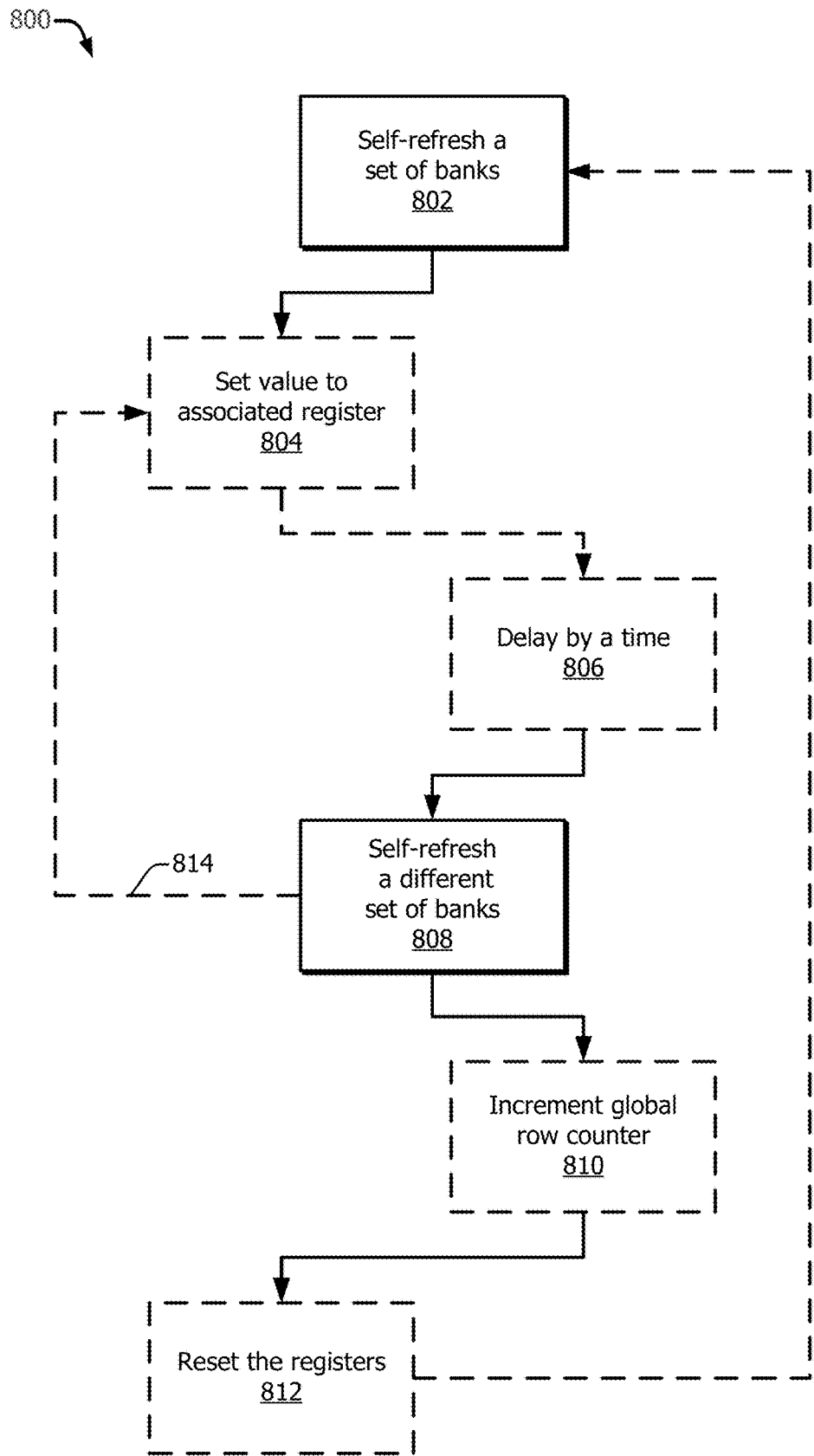
FIG. 8 illustrates an example flow diagram for implementing bank-level self-refresh.
Figure 9:
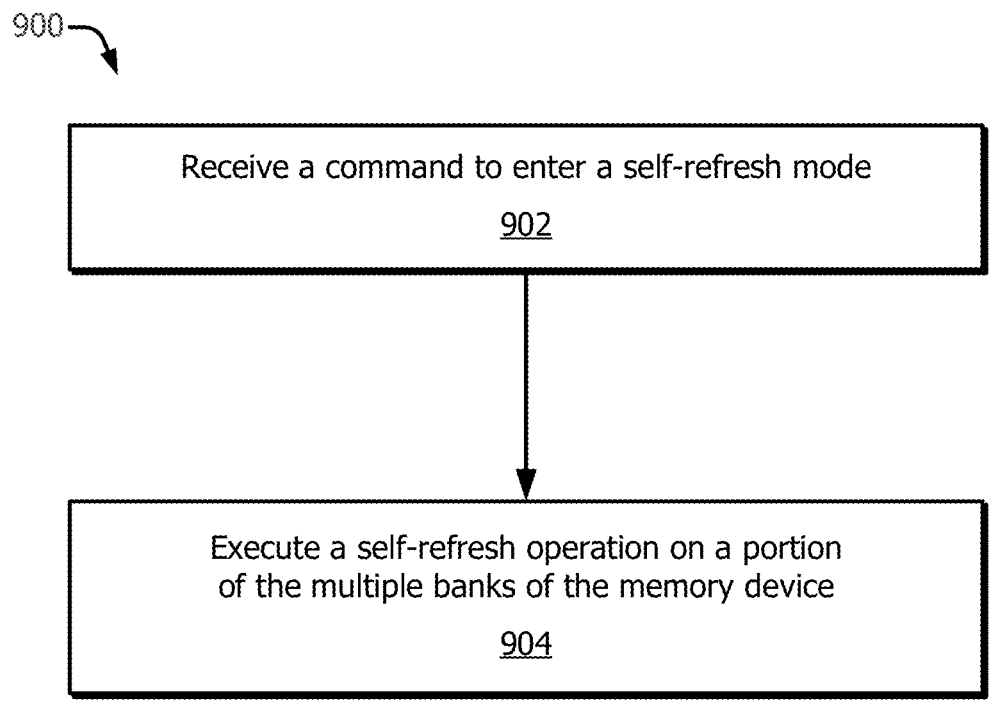
FIG. 9 illustrates an example method for implementing bank-level self-refresh.
Figure 10:
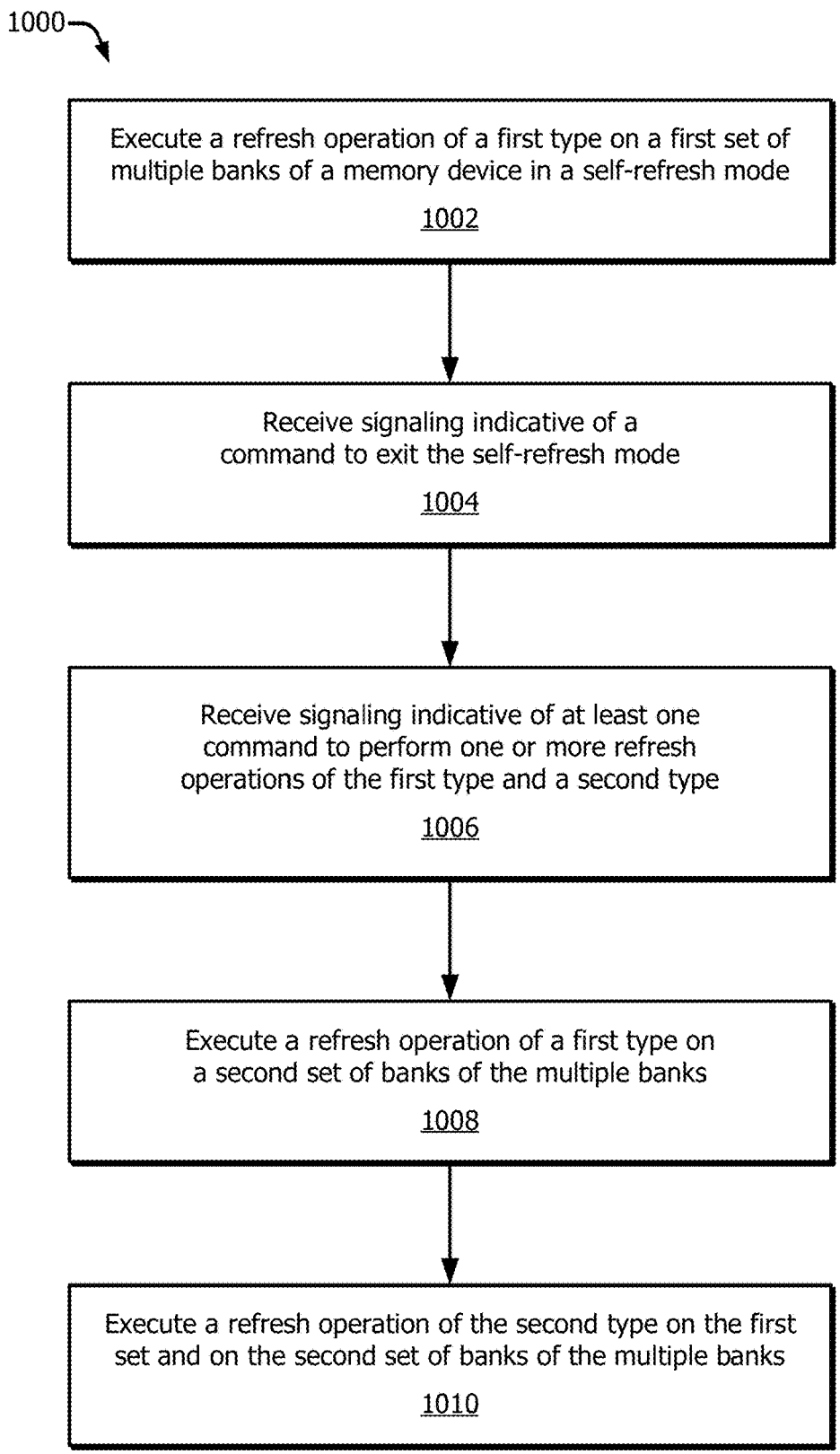
FIG. 10 illustrates an example method for implementing multiple types of refresh operations in accordance with one or more aspects of bank-level self-refresh.

This section describes example methods with reference to the flow charts of FIGS. 8 through 10 for implementing bank-level self-refresh for memory devices. These descriptions may also refer to components, entities, and other aspects depicted in FIGS. 1 through 7, which reference is made only by way of example. In aspects, the following example methods can be at least partially performed by the refresh controller 116. In other implementations, the example methods can be implemented at different functional places in the memory-access chain (e.g., at another controller in the memory device 108).

FIG. 8 illustrates an example flow diagram 800 for implementing bank-level self-refresh. The example flow diagram 800 begins in a self-refresh mode 702 that enables self-refresh operations of the memory device 108. At 802, a refresh controller 116 initiates self-refresh operations that are performed on a specific set of one or more word lines within a set (or portion) of banks of multiple banks of the memory device 108. The self-refresh operations may be initiated in the set of banks at a same or single time, or a bank stagger delay 602 may be executed between refresh operations on one or more banks within the set of banks.

In some implementations, the self-refresh operations may be tracked using one or more components, for example, the bank status register 510 or the global row counter 512. At 804, a first value may be stored in a register (e.g., the bank status register 510) associated with the set of banks to indicate that the set of banks performed the self-refresh operations on the specific set of word lines in a current refresh interval. In aspects, the bank status register 510 may include a register or bit associated with each of the banks 518 of the memory device 108. In other implementations, the bank status register 510 may be implemented as a single register capable of indicating which of the banks 518 have performed the self-refresh operations on the specific set of word lines in a current refresh interval.

Optionally at 806, a time delay (e.g., the refresh delay 604) may be executed between performing self-refresh operations on different sets of banks. For example, the refresh controller 116 may utilize the internal timer 514 to delay the initiation of a self-refresh operation in the different set of banks. In other implementations, the refresh delay 604 may be implemented as hold circuitry within the PDNs.

At 808, self-refresh operations are initiated on the specific set of word lines within the different set of banks. In aspects, the self-refresh operations are performed in a similar manner to the self-refresh operations at 802. The example process 800 may iteratively perform self-refresh operations on the specific set of word lines within the various sets of banks until all of the sets of banks have performed self-refresh operations on the specific set of word lines as indicated by arrow 814. Once all the sets of banks have performed self-refresh operations on the specific set of word lines, the process may continue at 810 where the global row counter is changed. In aspects, the global row counter 512 is incremented to indicate a new set of one or more word lines that are to perform self-refresh operations. For example, the global row counter may be altered from a current value indicative of a current set of word lines that have executed self-refresh operations for a current refresh interval to a new value indicative of a new set of word lines that have not yet executed self-refresh operations until a next refresh interval. At 812, the registers (e.g., the bank status register 510) may be reset to indicate the start of a new iteration of self-refresh operations. For example, the bank status register 510 may be set to store a value that indicates that the self-refresh operations have not been performed on the new set of one or more word lines within any of the banks 518.

In the example process 800, one or more aspects of bank-level self-refresh may be implemented to reduce the peak current required to perform self-refresh operations within the memory device 108. In aspects, the reduction in peak current may allow for reduction in metal mask layers to implement the PDN of the memory device 108. Moreover, the described techniques for bank-level self-refresh may allow for the self-refresh operations of the memory device 108 to be tracked, and thus enable the memory device 108 to seamlessly continue refresh operations when the self-refresh mode is exited by omitting the refreshing of banks responsive to an auto-refresh command if the banks were already refreshed in a self-refresh mode (e.g., in a current refresh interval or at a current global row counter value). In these ways, bank-level self-refresh may be particularly beneficial in instances when high-density memory is used, for example, in CXL implementations.

FIG. 9 illustrates an example method 900 for implementing bank-level self-refresh. At 902, signaling indicative of a command to enter a self-refresh mode 702 is received. In aspects, the signaling is transmitted by a memory controller 522 in communication with the memory device 108. The memory device 108 may enter the self-refresh mode 702 in response to receiving the signaling indicative of the command to enter the self-refresh mode 702. In the self-refresh mode 702, the memory device 108 may be enabled to perform self-refresh operations in accordance with one or more aspects of bank-level self-refresh.

At 904, a self-refresh operation may be executed on a portion of multiple banks of the memory device that is less than all of the multiple banks. In aspects, the portion of the multiple banks may be selected so as to maintain PDN displacement between the banks of the portion of the multiple banks such that the peak current is limited when the portion of the multiple banks performs self-refresh operations, as described above with reference to FIG. 6-1. The self-refresh operations may be performed iteratively throughout the different portions (or sets) of the banks 518. In so doing, the quantity of banks that perform self-refresh operations during a same time interval may be reduced to lower peak current.

FIG. 10 illustrates an example method 1000 for implementing multiple types of refresh operations in accordance with one or more aspects of bank-level self-refresh. At 1002, refresh operations of a first type are performed on a first set of one or more word lines within a first set of banks of multiple banks of the memory device 108 in a self-refresh mode 702. The refresh operations of the first type may be performed in accordance with a self-refresh mode 702 that is enabled to perform any of the above described aspects of bank-level self-refresh.

At 1004, signaling indicative of a command to exit the self-refresh mode 702 is received. The signaling may be transmitted by a memory controller 522 communicatively coupled to the memory device 108. In some implementations, the signaling is transmitted in response to the memory device 108 operating in accordance with the self-refresh mode 702 for a predetermined period of time. In the example method, the memory device 108 exits the self-refresh mode 702 in response to receiving the signaling indicative of the command to exit the self-refresh mode 702 and before self-refresh operations are performed on the first set of the one or more word lines within a second set of banks of the multiple banks of the memory device 108.

At 1006, signaling is received at the memory device 108 that is indicative of at least one command to perform one or more refresh operations of the first type and a second type. For example, the memory controller 522 may send signaling to the memory device 108 to perform the first type of refresh or a second, "special" type of refresh in the first or second set of banks of the multiple banks.

At 1008, refresh operations of a first type are performed on the first set of the one or more word lines within the second set of banks of the multiple banks of the memory device 108. In aspects, the refresh operations of the first type can be similar to those performed during the self-refresh mode in that the first-type refresh operations ensure that each word line within the banks 518 is refreshed at least once every refresh cycle. In some implementations, the self-refresh operations may be tracked using the registers 208 (e.g., the bank status register 510 and the global row counter 512). Outside the self-refresh mode 702, the refresh controller 116 may determine which of the banks 518 is to perform the refresh operation of the first type based on the registers 208. In this way, the memory die 502 may ensure that each of the banks 518 refreshes (e.g., with a self-refresh or an auto-refresh) each word line at least once per refresh cycle without redundant refreshes due to an exit from the self-refresh mode 702 during a refresh cycle.

Optionally, the memory device 108 may determine if a refresh operation of a second type should be performed on any one or more word lines within any of the banks 518. If determined that a refresh operation of the second type is to be performed, the memory controller 522 may initiate the refresh operation of the second type. At 1010, the refresh operation of the second type is performed on the first set of banks and on the second set of banks. In some implementations, the refresh operation of the second type may be performed on a different set of word lines than the set of word lines that implemented the refresh operations of the first type. The refresh operations of the second type may be performed on the first set of banks before, after, or during the execution of the refresh operation of the first type on the second set of banks at 1006. Similarly, the refresh operation of the second type on the second set of banks may be performed before, after, or during the refresh operation of the first type on the second set of banks. In aspects, performing the refresh operation of the second type on the second set of banks during a same time interval that the refresh operation of the first type is performed on the second set of banks reduces the time in which the second set of banks is disabled from "normal" memory accessing.

Figure 11:
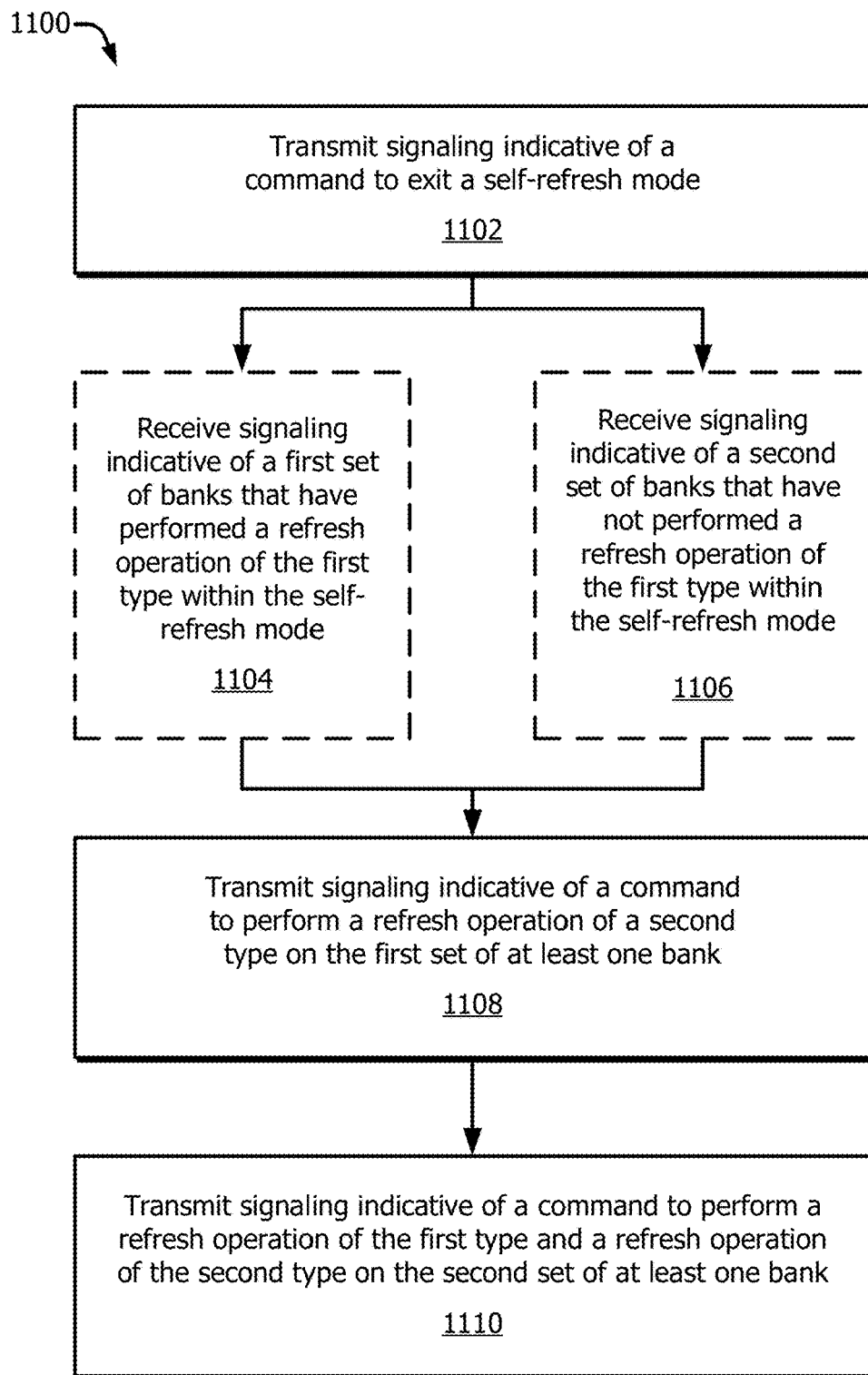
FIG. 11 illustrates an example method for implementing multiple types of refresh operations in accordance with one or more aspects of bank-level self-refresh.

FIG. 11 illustrates an example method 1100 for implementing multiple types of refresh operations in accordance with one or more aspects of bank-level self-refresh. At 1102, signaling indicative of a command to exit a self-refresh mode 702 may be transmitted. In aspects, the signaling may be transmitted from the memory controller 522 to the memory device 108 while the memory device 108 is within a self-refresh mode 702. In response, the memory device 108 may exit the self-refresh mode 702 and transmit signaling indicative of a last refresh operation performed in the self-refresh mode 702.

Optionally at 1104, signaling indicative of a first set of banks that have performed a refresh operation of the first type within the self-refresh mode 702 may be received. The signaling may be received by the memory controller 522 and indicate a current set of one or more word lines that is performing refresh operations or which banks of the multiple banks of the memory device 108 have performed the refresh operation of the first type on that current set of one or more word lines. The signaling may be transmitted responsive to the memory controller 522 transmitting signaling indicative of a request to read counter values from one or more registers 208. For example, the memory controller 522 may request to read the value stored in the global row counter 512 or the bank status register 510 to determine which set of one or more word lines is currently performing refresh operations or which of the multiple memory banks has performed the refresh operation within the self-refresh mode 702, respectively. In other examples, the signaling may be transmitted by the memory device 108 at each exit of the self-refresh mode 702. In aspects, the signaling may indicate a first set of banks that has performed a refresh operation of the first type on the current set of word lines while in the self-refresh mode.

Optionally at 1106, signaling indicative of a second set of banks that have not performed a refresh operation of the first type within the self-refresh mode 702 may be received. Similar to at 1104, the memory controller 552 may receive the signaling from the memory device 108 responsive to the reception of signaling from the memory controller 552. In aspects, the signaling received by the memory controller 552 may be indicative of a second set of at least one bank that has not performed the refresh operation of the first type within the self-refresh mode 702.

At 1108, signaling indicative of a command to perform a refresh operation of a second type on the first set of at least one bank is transmitted. The signaling may be transmitted from the memory controller 522 to the memory device 108 effective to cause the memory device 108 to perform the refresh operation of the second type on the first set of at least one bank. In some examples, the signaling may include a command to perform the refresh operation of the second type on a different set of one or more word lines than those which performed the last refresh operation of the first type while in the self-refresh mode 702.

At 1110, signaling indicative of a command to perform a refresh operation of the first type and a refresh operation of the second type on the second set of at least one bank is transmitted. The signaling may be transmitted from the memory controller 522 to the memory device 108 effective to cause the memory device 108 to perform a refresh operation of the first type and a refresh operation of the second type on the second set of at least one bank. For example, the command may include signaling that is effective to cause the memory device 108 to perform the refresh operation of the first type on a current set of one or more word lines that last performed the refresh operation of the first type while in the self-refresh mode 702. Additionally, or alternatively, the command may include signaling that is effective to cause the memory device 108 to perform the refresh operation of the second type on a set of word lines that is different from those that last performed refresh operation of the first type while in the self-refresh mode 702. In some implementations, this set of word lines may be the same or a different set of word lines as those that perform the refresh operation of the second type at 1108. Generally, the example methods described above may enable a memory device 108 to perform self-refresh operations and multiple types of refresh operations in accordance with one or more aspects of bank-level self-refresh as described herein.

For the example flow diagram and methods described above, the orders in which operations are shown and/or described are not intended to be construed as a limitation. Any number or combination of the described operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1 through 7, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although this document describes implementations for bank-level self-refresh in language specific to certain features or methods, the subject of the appended claims is not limited to the described features or methods. Instead, this document discloses the described features and methods as example implementations of bank-level self-refresh.

What is claimed is:

1. An apparatus comprising:
   at least one memory array including multiple banks; and
   logic coupled to the at least one memory array, the logic configured to:
   execute a self-refresh operation in a portion of the multiple banks that is fewer than all banks of the multiple banks;
   delay, by a time interval, execution of a second self-refresh operation in an additional portion of the multiple banks that is fewer than all banks of the multiple banks, the additional portion of the multiple banks different from the portion of the multiple banks; and
   execute the second self-refresh operation in the additional portion of the multiple banks.

2. The apparatus of claim 1, wherein the logic is further configured to:
   execute the self-refresh operation on a specific one or more word lines in the portion of the multiple banks; and
   execute the second self-refresh operation on the specific one or more word lines in the additional portion of the multiple banks.

3. The apparatus of claim 1, wherein the portion of the multiple banks and the additional portion of the multiple banks comprise a same quantity of banks.

4. The apparatus of claim 1, further comprising:
   a counter configured to store a number indicative of at least one word line; and
   at least one register associated with each bank of the multiple banks,
   wherein the logic is further configured to:
   execute the self-refresh operation in the portion of the multiple banks based on the number; and
   write a first value to the at least one register associated with a bank responsive to execution of the self-refresh operation in the bank.

5. The apparatus of claim 4, wherein the logic is further configured to:
   determine that the at least one register associated with each bank of the multiple banks has the first value written;
   write a second value to the at least one register associated with each bank of the multiple banks responsive to a determination that the at least one register associated with each bank of the multiple banks has the first value written;
   adjust the number of the counter responsive to the determination that the at least one register associated with each bank of the multiple banks has the first value written; and
   execute another self-refresh operation on at least one other word line in the portion of the multiple banks based on the adjusted number of the counter.

6. The apparatus of claim 1, wherein at least one bank of the portion of the multiple banks is coupled to a local power distribution network that is different from a local power distribution network of another bank of the portion of the multiple banks.

7. The apparatus of claim 1, wherein the logic is configured to:
   execute the self-refresh operation in at least one bank of the portion of the multiple banks;
   implement a time delay responsive to execution of the self-refresh operation in the at least one bank of the portion of the multiple banks; and
   execute another self-refresh operation in at least one other bank of the portion of the multiple banks responsive to the time delay.

8. The apparatus of claim 1, wherein a quantity of banks of the portion of the multiple banks is one, two, four, or eight banks.

9. The apparatus of claim 1, further comprising a global power distribution network coupled to one or more local power distribution networks that provide power to different banks of the portion of the multiple banks.

10. The apparatus of claim 1, wherein the logic is further configured to:
    enter a self-refresh mode, which enables execution of multiple self-refresh operations, responsive to receipt from a memory controller of signaling indicative of a command to enter the self-refresh mode; and
    exit a self-refresh mode, which enables execution of multiple self-refresh operations, responsive to receipt from a memory controller of signaling indicative of a command to exit the self-refresh mode.

11. The apparatus of claim 1, wherein:
    the apparatus comprises a Compute Express Link® (CXL®) device; and
    the logic is coupled to at least one die via an interconnect that is internal to the CXL device.

12. A method comprising:
    receiving, at a memory device, a command to enter a self-refresh mode;
    executing, at the memory device, a self-refresh operation on a portion of multiple banks of the memory device responsive to the receiving, the portion of the multiple banks fewer than all banks of the multiple banks;

delaying, by a time interval, executing of a second self-refresh operation on a second portion of the multiple banks responsive to the executing of the self-refresh operation on the portion of the multiple banks, the second portion of the multiple banks different from the portion of the multiple banks; and executing, at the memory device, the second self-refresh operation on the second portion of the multiple banks of the memory device.

13. The method of claim 12, further comprising:

utilizing an internal timer of the memory device to delay, by the time interval, the executing of the second self-refresh operation on the second portion of the multiple banks.

14. The method of claim 12, further comprising:

executing a first self-refresh operation on at least one bank of the portion of the multiple banks;

delaying, by another time interval, execution of a second self-refresh operation on at least one other bank of the portion of the multiple banks; and executing the second self-refresh operation on the at least one other bank responsive to the delaying by the other time interval.

15. The method of claim 12, further comprising:

executing the self-refresh operation on a first set of word lines of the multiple banks of the memory device;

writing a first value to at least one register associated with at least one respective bank of the multiple banks responsive to the executing of the self-refresh operation on the at least one respective bank of the multiple banks; and executing a second self-refresh operation on a second set of word lines of the portion of the multiple banks of the memory device in response to the executing of the self-refresh operation on the first set of word lines of the multiple banks of the memory device, the second set of word lines different from the first set of word lines.

16. The method of claim 15, further comprising:

determining that the self-refresh operation has been executed on the first set of word lines of the multiple banks of the memory device based on the writing of the first value to the at least one register associated with each respective bank of the multiple banks, the first value indicative that a self-refresh has been executed for a current row counter value; and writing a second value to the at least one register associated with each respective bank of the multiple banks in response to the determining, the second value indicative that a self-refresh has not been executed for a next row counter value.

17. An apparatus comprising:

at least one memory array including multiple banks; and logic coupled to the at least one memory array, the logic configured to:

execute a self-refresh operation in a portion of the multiple banks that is fewer than all banks of the multiple banks, at least one bank of the portion of the multiple banks coupled to a first local power distribution network that is different from a second local power distribution network of another bank of the portion of the multiple banks.

18. The apparatus of claim 17, further comprising:

a global power distribution network coupled to two or more local power distribution networks that provide power to different banks of the portion of the multiple banks.

19. The apparatus of claim 18, wherein:

each local power distribution network of the two or more local power distribution networks is coupled to at least two banks of the multiple banks; and the two or more local power distribution networks include the first local power distribution network and the second local power distribution network.

20. The apparatus of claim 18, wherein:

the two or more local power distribution networks comprise four or more local power distribution networks; and the apparatus further comprises multiple regional power distribution networks, each regional power distribution network including at least two local power distribution networks of the four or more local power distribution networks.

* * * * *